(12) United States Patent
Watanabe et al.

(10) Patent No.: US 6,252,272 B1
(45) Date of Patent: Jun. 26, 2001

(54) SEMICONDUCTOR DEVICE, AND METHOD OF FABRICATING THE SAME

(75) Inventors: Hiroshi Watanabe, Kawasaki; Hitoshi Itoh, Kunitachi; Ken Uchida, Sagamihara, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/267,607

(22) Filed: Mar. 15, 1999

(30) Foreign Application Priority Data

Mar. 16, 1998 (JP) .................................................. 10-65920
Mar. 17, 1998 (JP) .................................................. 10-67246

(51) Int. Cl.$^7$ ............................................... H01L 29/788
(52) U.S. Cl. ......................... 257/315; 257/288; 257/321; 257/622
(58) Field of Search ........................... 257/288, 315–317, 257/321, 365, 368, 622

(56) References Cited

U.S. PATENT DOCUMENTS 4,169,291 * 9/1979 Roessler ............................... 257/316
5,296,719 * 3/1994 Hirai et al. ............................ 257/14
6,011,271 * 1/2000 Sakuma et al. ....................... 257/25

FOREIGN PATENT DOCUMENTS 2-14582 * 1/1990 (JP) ..................................... 257/317

OTHER PUBLICATIONS

S.B. Hsu et al., "Multiple V–Groove FET" IBM Technical Disclosure Bulletin, vol. 19 No. 6 (Nov. 1976) pp. 2135–2136.*
F. Holmes et al., "VMOS–A New MOS Integrated Circuit Technology", Solid–State Electronics, vol. 17, pp 791–797, Pergammon Press, 1974.

Y. Awano et al., "Electrical and Optical Properties of Quantum DOt Structures: Magnetic–Confined and Tetrahedral–Shaped Recess (TSR) Quantum Dots", 15$^{th}$ Symposium on Future Electron Devices, pp46–51, Oct. 7–8, 1996.

Y. Ishikawa et al., "Creation of [110]–Aligned Si Quantum Wires encompassed by Sio$_2$ Using Low–Energy Seperation––By–Implanted–Oxygen on a V–Groove patterned Substrate", Applied Physics Letters, vol. 72, No. 20, pp. 2592–2594, Sep. 10., 1998.

* cited by examiner

*Primary Examiner*—Sara Crane
(74) *Attorney, Agent, or Firm*—Finnegan, Henderson, Farabow, Garrett, & Dunner, L.L.P.

(57) ABSTRACT

A surface portion of a semiconductor substrate 41 is serrated at intervals equal to a minimum processing size to form impurity diffusion layers in peaks. These impurity diffusion layers are isolated from each other by valleys. At a valley where a gate is formed, the gate and impurity diffusion layers and in peaks on the two sides of the gate form a MOS transistor. A valley in which no gate is formed functions as an element isolation region. Since a MOS transistor or an element isolation region is formed in one valley, the element area is reduced.

A surface of a p-type semiconductor substrate is serrated to form n$^+$-type impurity regions in peaks and floating gates having an upper spired portion in valleys via a silicon oxide film. Control gates are formed on the floating gates via a tunnel oxide film. The lower portion of the control gate has a shape corresponding to the valley and opposes the upper portion of the floating gate by self-alignment. Data is written or erased by using a tunnel current flowing of electrons through the tunnel oxide film between the floating gate and control gate having the above-mentioned shapes and positional relationship. This achieves micropatterning and reduces the maximum operating voltage at the same time.

8 Claims, 24 Drawing Sheets

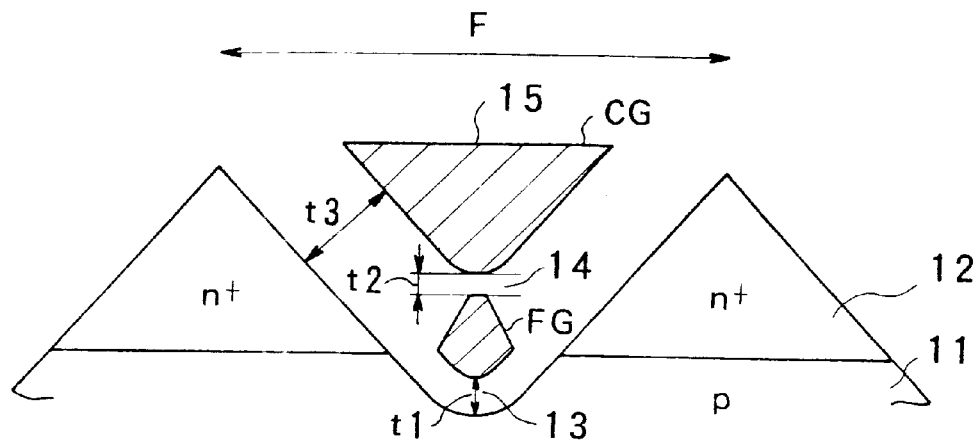
F I G. 12
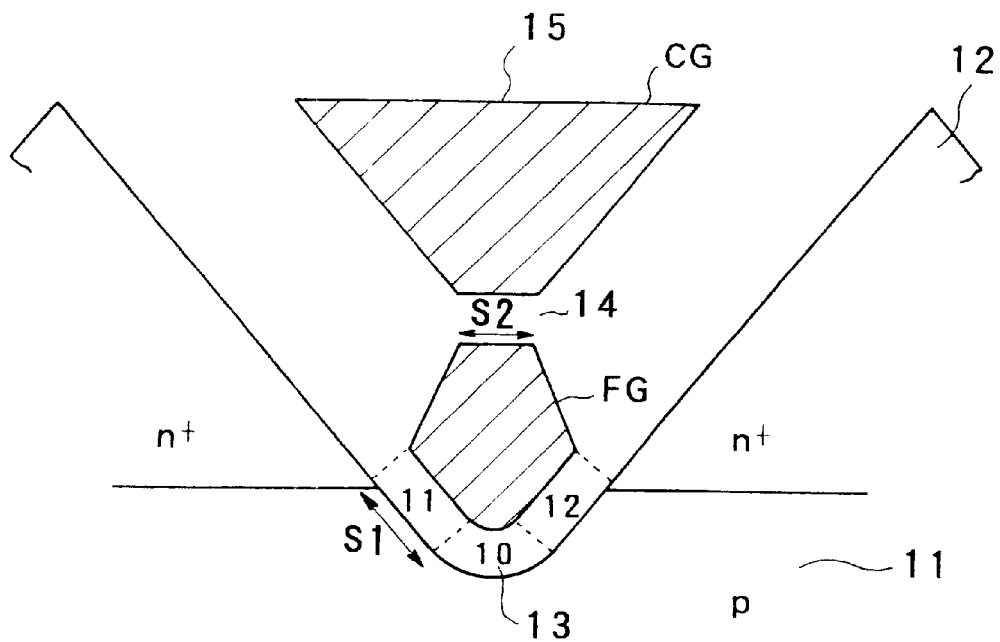
F I G. 13

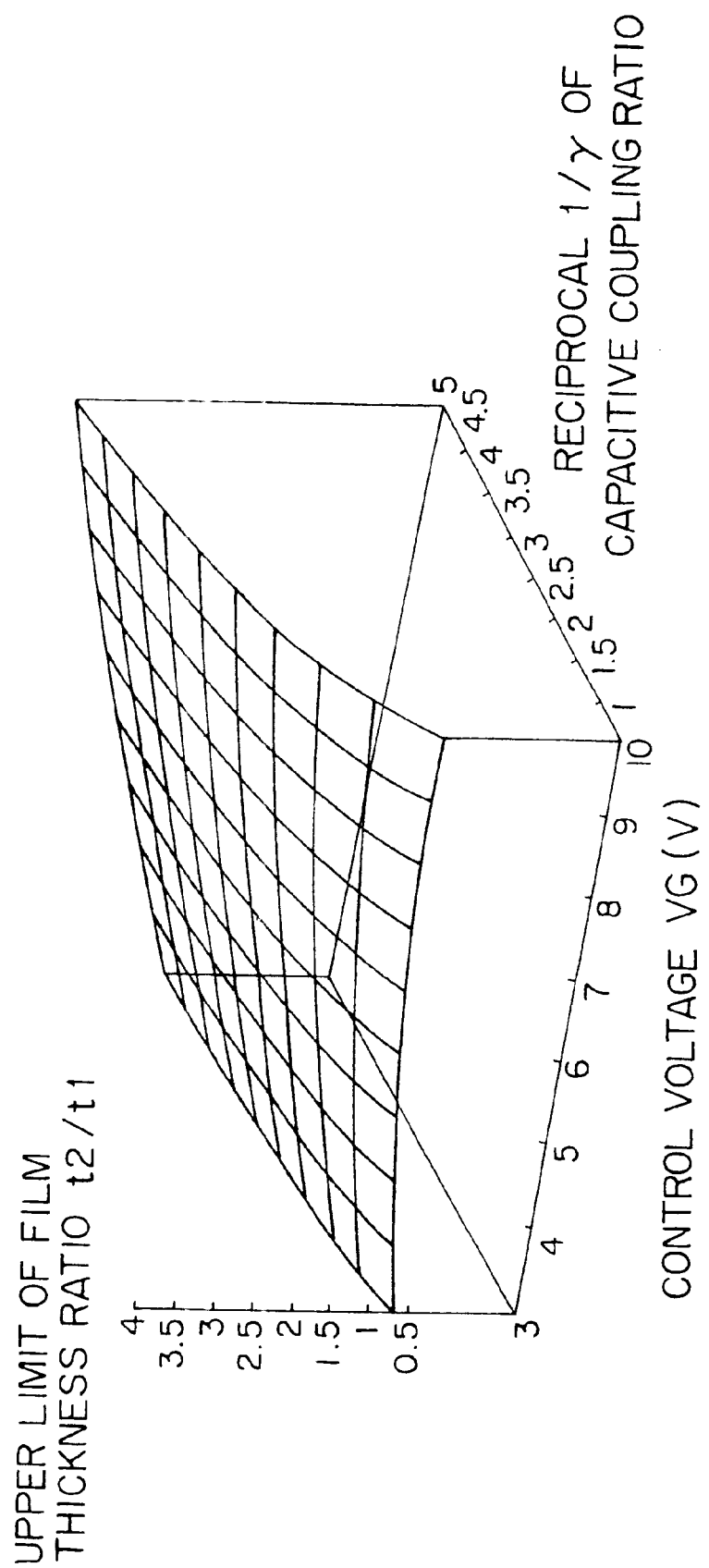
F I G. 14

COMPARISON OF FLASH MEMORY CELL ARRAY TYPES (STORAGE ELEMENT CAN BE EITHER STACKED GATE OR SPLIT GATE ELEMENT)

| | PARALLEL CONNECTION | | | SERIES CONNECTION |
|---|---|---|---|---|
| | NOR TYPE | IMAGINARY GROUND TYPE | AND TYPE | NAND TYPE |
| ARRAY STRUCTURE ☐ BIT LINE CONTACT | | | | |
| BIT LINE — MAIN | METAL | DIFFUSION LAYER, METAL | METAL | METAL |
| BIT LINE — SUB | DIFFUSION LAYER, METAL | DIFFUSION LAYER, METAL (ADJACENT BIT LINE) | DIFFUSION LAYER, METAL | DIFFUSION LAYER, METAL |
| SOURCE LINE — MAIN | — | — | DIFFUSION LAYER | INTRA-BLOCK MEMORY CELL |
| SOURCE LINE — SUB | — | — | — | INTRA-BLOCK MEMORY CELL |
| BIT LINE CONTACT | 1 CONTACT/2 CELLS | 1 CONTACT/32 - 64 CELLS | 1 CONTACT/128 CELLS | 1 CONTACT/16 - 32 CELLS |
| MERITS | • LOW PARASITIC RESISTANCE RAPID RANDOM READ | SMALL LAYOUT AREA | • REWRITE IN UNITS OF WORD LINES • SMALL LAYOUT AREA | SMALL LAYOUT AREA |
| PRACTICAL PROBLEMS AND COUNTERMEASURES | • LARGE LAYOUT AREA SELF-ALIGNMENT PROCESS | • SUPPRESSION OF WRITE DISTURBANCE SPLIT GATE STRUCTURE | • HIGH DIFFUSION LAYER INTERCONNECTION DENSITY SELF-ALIGNMENT PROCESS | • LARGE PARASITIC RESISTANCE USE EXCLUSIVELY FOR SERIAL READ |
| OPTIMUM USE | BUILT-IN DEVICE | MASS-STORAGE SYSTEM | MASS-STORAGE SYSTEM | MASS-STORAGE SYSTEM |

FIG. 19

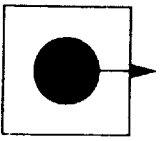 GATE CONTACT FORMED TO LEFT OF TRANSISTOR
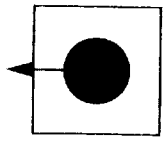 GATE CONTACT FORMED TO RIGHT OF TRANSISTOR
 DOUBLE GATE TRANSISTOR FORMED IN VALLEY
 CONTACT HOLE FOR SOURCE LINE
 CONTACT HOLE FOR BIT LINE
 SINGLE GATE TRANSISTOR
FIG. 20

AND TYPE

CELL AREA:15F²      MAXIMUM INTERNAL VOLTAGE:8[V]OR LESS

SEMICONDUCTOR DEVICE, AND METHOD OF FABRICATING THE SAME

BACKGROUND OF THE INVENTION

The present invention relates to a semiconductor device and a method of fabricating tho came.

In conventional semiconductor devices, impurity diffusion layers, gates, and contact holes, and so on are formed in a surface portion of a flat semiconductor substrate by using resist patterns. FIG. 1 shows the sectional structure of a conventional MOS transistor. A drain 62 and a source 63 each made of an n-type impurity diffusion layer are formed at a predetermined interval in a surface portion of a flat p-type semiconductor substrate 61. A gate electrode 65 is formed on the resultant surface via a gate oxide film 64 to form an n-channel fOS transistor 66. In this conventional semiconductor device, however, the size of a fabricable transistor is unavoidably larger than the minimum processing size F corresponding to the limits of photolithography; generally, a size of 2F is necessary. For this reason, it is conventionally impossible to unlimitedly increase the degree of integration.

In conventional semiconductor devices as described above, elements are formed on the surface of a flat semiconductor substrate, and this requires a size larger than the minimum processing size F. So, the degree of integration cannot be increased.

Also, semiconductor memories have greatly improved with the recent micropatterning. However, straightforward development of conventional technology is against the trend to reduce a power consumption required by a high integration degree of LSIS. For example, in a non-volatile memory device, if an operating voltage was reduced with the reliability of a tunnel oxide film kept high, the efficiency of injection of electrons into a floating gate decreases.

For example, letting F be the minimum processing size in state-of-the-art general nonvolatile semiconductor memories, an element area of about $5.5F^2$ is necessary even for a cell with the simplest cell structure and the minimum cell area. To write data by injecting electrons into the floating gate or erase data by extracting injected electrons from the floating gate of even a cell of this size, a very high electric field of, e.g., 18 V must be applied to cause FN tunneling in the tunnel oxide film.

Additionally, a strong electric field is applied not only to the tunnel oxide film between the substrate and the floating gate but also to an insulating film between the floating gate and the control gate. Therefore, to allow a tunnel current to flow only through the tunnel oxide film to make efficient data write or erase possible, the ratio of the thickness of the tunnel oxide film to that of the insulating film is adjusted to decrease the capacitive coupling ratio $\gamma(=C1/C2)$ of the capacitance C2 of the tunnel oxide film to the capacitance C1 of the insulating film. However, even when this is performed, the maximum operating voltage is still high, about 18 V, when data is written in or erased from conventional semiconductor memories.

On the other hand, in devices whose maximum operating voltage is as low as 12 V, the voltage required to write or erase data is decreased by using, e.g., channel hot electron injection. This, however, complicates the cell structure and takes the cell area very large, $11.5F^2$.

As described above, no conventional semiconductor memories can reduce the cell area and the maximum operating voltage at the same time.

SUMMARY OF THE INVENTION

It is, therefore, an object of the present invention to provide a semiconductor device whose degree of integration can be increased and a method of fabricating the same.

It is another object of the present invention to provide a semiconductor device capable of achieving micropatterning and large reduction of the maximum operating voltage at the same time.

According to the present invention, a semiconductor device comprises, a serrated substrate whose surface is processed go that a section in a row direction is serrated that intervals between tops of peaks or between bottoms of valleys in the section are decreased to a minitmum processing size and the peaks and valleys alternately and repeatedly formed in the row direction of the surface extend in a column direction of the surface, a functional element including a thin linear gate formed to extend in the column direction in a valley via the insulating film and an impurity diffusion layer formed in two peaks on two sides of the valley in which the gate is formed, and a row-direction element isolation layer selectively formed in a valley by burying an insulating substance in the valley without forming a gate, the row-direction element isolation layer electrically isolating two functional elements arranged on two sides of the valley in the row direction.

The surface of a semiconductor substrate can be serrated in accordance with the minimum processing size. A gate formed in a valley and impurity diffusion layers formed in peaks on the two sides of the valley form a functional element. The impurity diffusion layers of this functional element are isolated from each other because the adjacent valley functions as an element isolation region. Since the functional element or the element isolation region is formed in a valley corresponding to the minimum processing size, the element area is reduced.

In a complementary semiconductor device of the present invention, the function element comprises a first-conductivity type functional element including impurity diffusion layers of a first conductivity type formed in first and second adjacent peaks, a second-conductivity type region in a first valley between the first and second peaks, and a first thin linear gate formed in the first valley in the column direction via the insulating film, and a second-conductivity type functional element including impurity diffusion layers of a second conductivity type formed in third and fourth adjacent peaks, a Legion of the first conductivity type in a second valley between the third and fourth peaks, and a second thin linear gate formed in the second valley in the column direction via the insulating film.

This device can further comprise, on the serrated substrate, a column-direction element isolation layer formed by burying an insulating substance in a trench linearly extending in the row direction and deeper than the valleys.

In this device, a direction in which a driving current flows in the functional element can be the row direction of the serrated substrate. This increases the driving current and reduces an occupied area of the functional element at the name time.

According to the present invention, a method of fabricating a semiconductor device comprises the steps of serrating a surface of a semiconductor substrate, on which an impurity diffusion layer is formed, in accordance with a minimum processing size to form peaks made of the impurity diffusion layer and valleys for separating the impurity diffusion layer, and selectively forming gates in predetermined valleys, wherein the impurity diffusion layer in peaks on two sides of a valley in which the gate is formed and the gate form a functional element in the valley in which the gate is formed, and a peak in which the gate is not formed is used as an element isolation region.

According to the present invention, a method of fabricating a semiconductor device by which the surface of a semiconductor substrate is serrated comprises the steps of doping an impurity into a surface portion of a semiconductor substrate to form an impurity diffusion layer, forming a mask material patterned into a predetermined shape at intervals equal to a minimum processing size on a surface of the impurity diffusion layer, anisotropically etching the surface portion of the semiconductor substrate by using the mask material as a mask to form V-shaped grooves deeper than the impurity diffusion layer, burying an insulating film in the grooves, removing the mask material to expose the surface of the semiconductor substrate, anisotropically etching the exposed surface portion of the semiconductor substrate not covered with the insulating film to form V-shaped grooves deeper than the impurity diffusion layer, and removing the insulating film to obtain a semiconductor substrate on which peaks and valleys are arranged at intervals equal to the minimum processing size to form a serrated shape.

According to the present invention, a method of fabricating a semiconductor device by which element isolation is performed in a column direction on the surface of a semiconductor substrate and the surface is processed so as to have a serrated section in a row direction comprises the steps of forming a first resist film for element isolation in a column direction on the surface of a semiconductor substrate on which an impurity diffusion layer is formed, forming trenches deeper than the impurity diffusion layer in the surface portion of the semiconductor substrate not covered with the first resist film, burying an insulating film in the trenches, removing the first resist film, forming a second resist film for serration in a row direction at intervals equal to a minimum processing size, anisotropically etching a surface portion of the semiconductor substrate not covered with the second resist film to form V-shaped grooves deeper than the impurity diffusion layer and shallower than the trenches, and removing the second resist film, wherein a semiconductor substrate in which peaks and valleys are isolated in the column direction by the trenches and arranged so as to form a serrated shape at intervals equal to the minimum processing size in the row direction is obtained.

According to the present invention, a method of fabricating a semiconductor device by which the surface of a semiconductor substrate is serrated to form gates in valleys and form gate contacts, comprises the steps of: in a surface portion of a semiconductor substrate in which first trenches filled with a first insulating film to perform element isolation in a column direction are formed, peaks and valleys are arranged at intervals equal to a minimum processing size in a row direction to form a serrated shape, and impurity diffusion layers are formed in the peaks and isolated from each other, forming second trenches deeper than bottom surfaces of the valleys and adjacent to valleys for forming gates in a region where the first trenches are formed, forming a second insulating film on surfaces of the peaks and valleys of the semiconductor substrate not covered with the insulating film, covering predetermined valleys in which no gates are to be formed with a first mask material, depositing a conductive material in valleys not covered with the first mask material and on the bottom surfaces of the second trenches adjacent to the valleys, thereby forming gates on the botton surfaces of the valleys and forming a conductive film, connected to the gates, on the bottom surfaces of the second trenches, removing the first mask material and forming a second mask material so as to cover the entire region where the first trenches are formed, depositing a third insulating film in the portion not covered with the second mask material to planarize the portion and removing the second mask material, and forming gate contacts by depositing a conductive material on the surface of the conductive film formed on the bottom surfaces of the second trenches.

The semiconductor device of the present invention comprises a semiconductor substrate having peaks and valleys formed by serrating a surface of the semiconductor substrate, floating gates formed in the valleys of the semiconductor substrate via a first insulating film and having an upper spired portion, and control gates formed on the floating gates in the valleys of the semiconductor substrate via a second insulating film and having a lower portion with a shape conforming to the valley, wherein an upper end portion of the floating gate and a lower end portion of the control gate oppose each other via the second insulating film.

The upper portion of the floating gate is formed into the shape of a spire, and the end of this upper portion of the floating gate and the end of the lower portion of the control gate having the shape conforming to the valley oppose each other. This reduces the maximum operating voltage necessary to inject or extract electrons into or from the floating gate. The floating gate and the control gate are formed in the valley in the serrated surface of the semiconductor substrate, and elements are formed in units of these valleys. This reduces the element area.

In this device, electrons can be injected into the floating gate or injected electrons can be extracted from the floating gate by generating a tunnel current between the floating gate and the control gate via the second insulating film.

In this device, a capacitive coupling ratio of a first capacitance formed by the semiconductor substrate, the first insulating film, and the floating gate to a second capacitance formed by the floating gate, the second insulating film, and the control gate can be set by a ratio of the size of a bottom surface of the floating gate to the size of a bottom surface of the control gate.

According to the present invention, there is provided A NAND nonvolatile semiconductor device in which one terminal of a first transistor having a selector gate, both terminals of each of at least two memory cell transistors each having a floating gate and a control gate, and one terminal of a second transistor having a selector gate are connected in series, the other terminal of the first transistor is connected to a selecting line, and the other terminal of the second transistor is connected to a bit line, wherein on a semiconductor substrate having peaks and valleys formed by serrating a surface of the semiconductor substrate, impurity diffusion layers being formed in the peaks and isolated from each other by the valleys, the first transistor has a selector gate formed in a valley via a first insulating fill or first and second insulating films and impurity diffusion layers formed in peaks on two sides of the valley, at least two memory cell transistors have floating gates formed via the first insulating film in at least two continuous valleys adjacent to the valley in which the selector gate of the first transistor is formed and having an upper spired portion, control gates formed on the floating gates to oppose the floating gates via the second insulating film, and impurity diffusion layers formed in peaks on two sides of each valley, the second transistor has a selector gate formed via the first insulating film or the first and second insulating films in a valley adjacent to at least two continuous valleys in which the floating gates of the memory cell transistors are formed, and impurity diffusion layers formed in peaks on two sides of the valley, and one of the two impurity diffusion layers of the first transistor not shared by an adjacent memory cell transistor is connected to a selecting line, and one of the two impurity diffusion layers of the second transistor not shared by an adjacent memory cell transistor is connected to a bit line.

According to the present invention, a method of fabricating a semiconductor memory comprises the steps of serrating a surface of a semiconductor substrate to form peaks and valleys, forming a first insulating film on the valleys of the semiconductor substrate, forming floating gates by depositing a conductive material on a surface of the first insulating film in the valleys of the semiconductor substrate, forming an insulating film to process an upper portion of the floating gate into a shape of a spire, forming a second insulating film in the valleys of the semiconductor substrate so as to cover the surface of the floating gate and the first insulating film, and forming control gates In the valleys of the semiconductor substrate by depositing a conductive material on the floating gates via the second insulating film, a lower portion of the control gate protruding downward and self-aligning with the upper spired portion of the floating gate.

BRIEF DESCRIPTION OF THE DRAWINGS

FIG. 12 is a longitudinal sectional view showing the structure of a semiconductor memory according to the embodiment of the present invention;

FIG. 13 is a longitudinal sectional view showing details of the floating gate of the semiconductor memory;

FIG. 14 is a graph showing the relationship between the film thickness ratio, control gate voltage, and capacitive coupling ratio in the semiconductor memory;

FIG. 19 is a table comparing cell array types of flash memories;

FIGS. 20 to 22 are views for explaining symbols used in FIGS. 23 to 30;

DESCRIPTION OF THE PREFERRED EMBODIMENTS

One embodiment of the present invention will be described in detail below with reference to the accompanying drawings.

Figure 4:
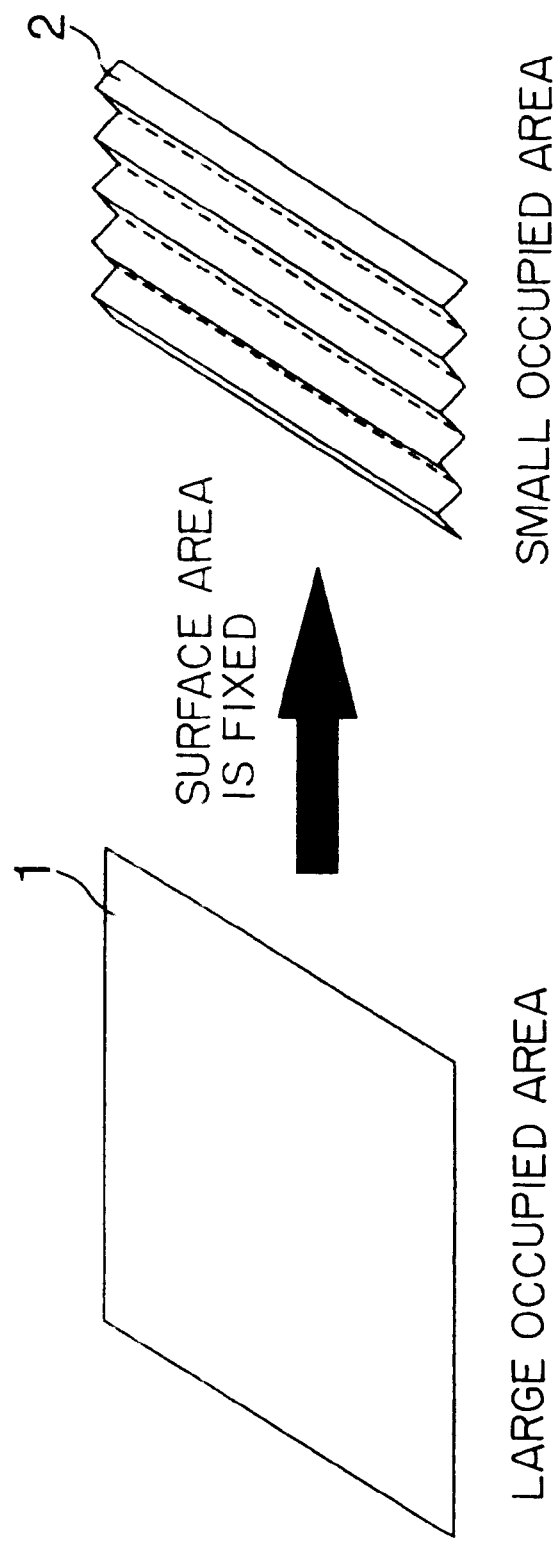
FIG. 4 is a view showing the principle by which an element area is decreased by the embodiment.

This embodiment is based on the following idea. As shown in FIG. 4, the area occupied of a flat semiconductor substrate 1 having a smooth surface is large. However, when a semiconductor substrate 2 having a serrated surface is used, it is possible to decrease the area occupied and increase the degree of integration for the same surface area.

This embodiment increases the degree of integration by selectively forming functional elements or element isolation regions in the surface portion of the semiconductor substrate 2 having the serrated surface. When the surface is serrated, intervals between peaks are equal to the minimum processing size F, and one lateral VMOSFET (V-shaped Metal Oxide Semiconductor Field Effect Transistor) in which a driving current flows parallel to the substrate surface is formed in each valley. When a gate is formed in a valley, the gate and the impurity diffusion layers in peaks on the two sides of the valley form one functional element corresponding to a single MOS transistor. When no gate in focal iii a valley, the valley functions as an element isolation region.

Next, a procedure for serrating the surface of a semiconductor substrate to form peaks and valleys in accordance with a fabrication method of this embodiment will be described below.

Figure 3:
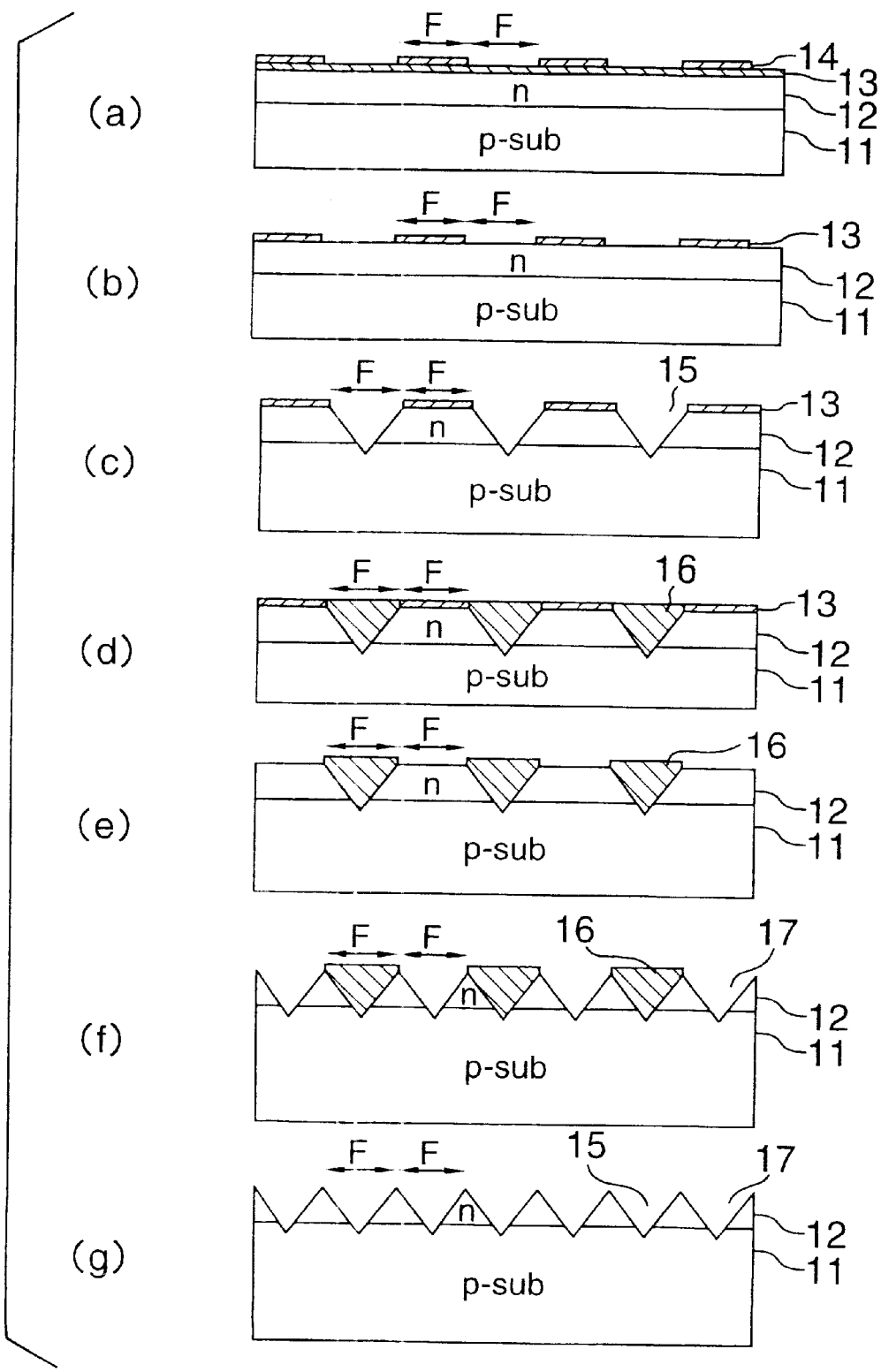
FIGS. 3A to 3G are longitudinal sectional views showing the steps of a procedure for serrating the surface portion of a semiconductor substrate in a semiconductor device fabrication method according to the embodiment of the present invention.

First, as shown in FIG. 3A, an n-type impurity is doped into the (100) surface of a p-type semiconductor substrate 11 to form an n-type impurity diffusion layer 12. For example, this diffusion layer 12 can be formed as follows. A silicon oxide film or a silicon nitride film is formed on the surface of the semiconductor substrate 11 while an n-type impurity is doped. Alternatively, impurity ions are implanted after the film is formed. After that, the doped impurity is diffused into the surface of the semiconductor substrate 11 by thermal diffusion.

A silicon nitride (SiN) film 13 is formed as a mask material on the entire surface of the n-type impurity diffusion layer 12 by using CVD (Chemical Vapor Deposition). The surface of this silicon nitride film 13 is coated with a resist, and this resist is patterned into a desired shape to form resist films 14. Intervals between these resist films 14 are equal to the minimum processing size F.

As shown in FIG. 3B, the resist films 14 are used as masks to perform reactive ion etching on the silicon nitride film 13, thereby forming patterned silicon nitride films 13. After that, the resist films 14 are removed.

As shown in FIG. 3C, the silicon nitride films 13 are used as masks to perform crystallographic surface anisotropic etching (see "LSI Handbook", The ORM-Sha, Ltd., pp. 264 and 265) on the surface of the semiconductor substrate 11 to form v-shaped grooves 15 so as to expose the (111) surface. The depth of the n-type diffusion layer 12 and the depth of the grooves 15 are so set that the surface of the p-type semiconductor substrate 11 is exposed to the valley of each trench 15. Residual portions of the n-type diffusion layer 12 in peaks are isolated from each other by the grooves 15.

As shown in FIG. 3D, a silicon oxide film (SiO$_2$) film 16 is deposited by CVD so as to bury the grooves 15.

As shown in FIG. 3E, an H$_3$PO$_4$ solution is used at 180° C. to remove the silicon nitride films 13 and expose the surface of the semiconductor substrate 11 to these portions.

As shown in FIG. 3F, the silicon oxide film 16 is used as a mask to again perform cirystallographic surface anisotropic etching on the exposed surface of the semiconductor substrate 11. Consequently, V-shaped grooves 17 are formed in the surface of the semiconductor substrate 11 not covered with the silicon oxide film 16. After that, the silicon oxide film 16 is removed by using hydrofluoric acid. The result is a serrated structure, as shown in FIG. 3G, in which the n-type impurity diffusion layer 12 is divided by the grooves 15 and 17 formed by the second crystallographic surface anisotropic etching.

To arrange a plurality of cells in a matrix manner on the surface of a substrate, cells arranged in adjacent rows must be isolated along a column direction, A procedure of forming trenched element isolation regions in the column direction before the surface of a semiconductor substrate is serrated through the aforementioned steps will be described below with reference to FIGS. 5A to 5D showing plan views of the semiconductor substrate. Assume that an n-type impurity diffusion layer 21 is previously formed on the surface of this semiconductor substrate.

Figure 5:
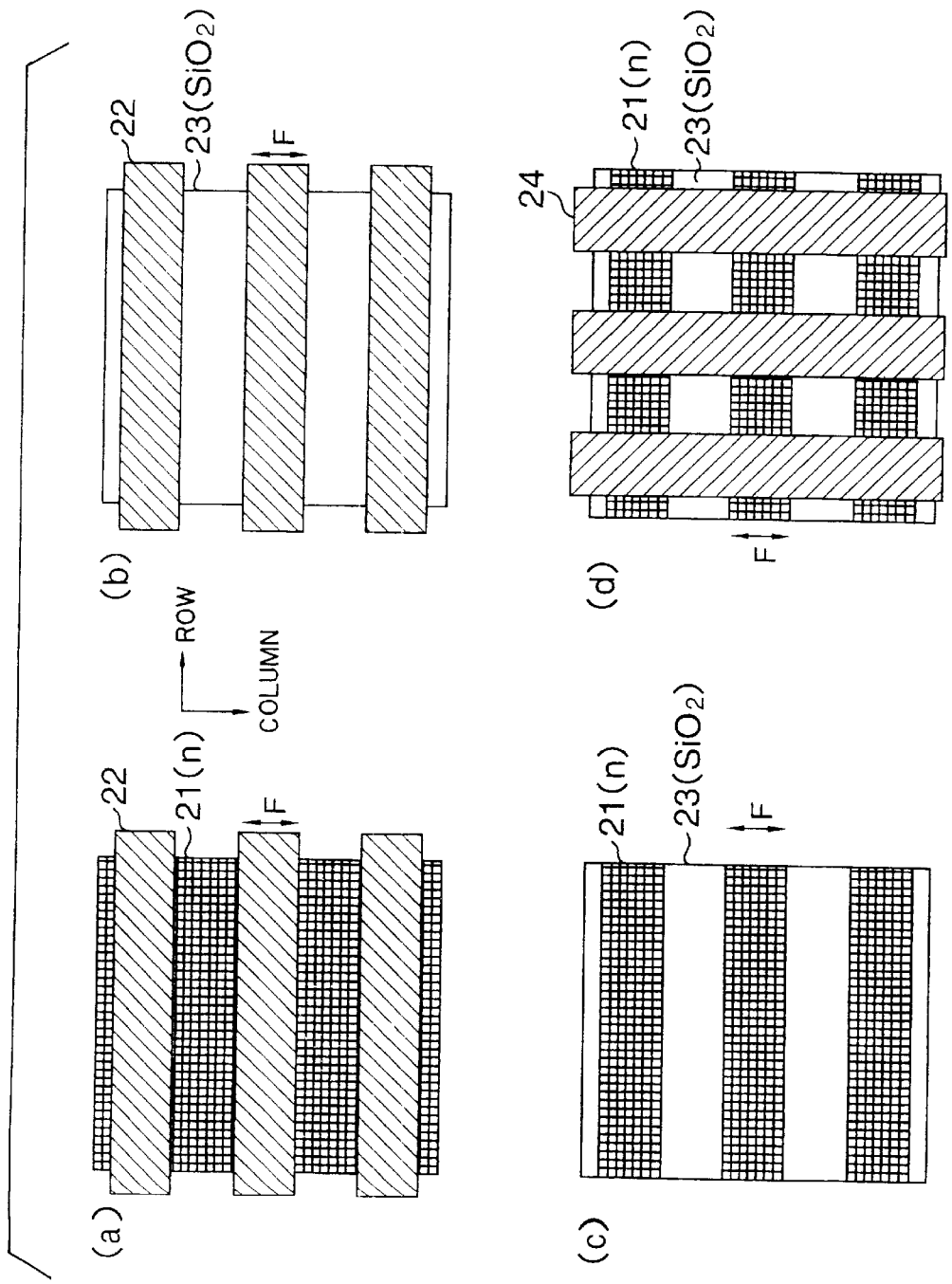
FIGS. 5A to 5D are plan views showing the steps of a procedure for forming element isolation regions for isolation in a column direction in the semiconductor device fabrication method of the embodiment.

As shown in FIG. 5A, resist films 22 patterned at intervals equal to the minimum processing size F to perform element isolation in the column direction are formed on the n-type impurity diffusion layer 21 formed on the surface of the semiconductor substrate. These resist films 22 are used as masks to etch the surface of the semiconductor substrate and form trenches. To bury the trenches thus formed, as shown in FIG. 5B, a silicon oxide film (SiO$_2$) 23 is deposited by using CVD.

As shown in FIG. 5C, the resist films 22 are removed to expose the surface of the n-type impurity diffusion layer 21.

After element isolation in the column direction is performed, the surface of the semiconductor substrate is serrated. AS shown in FIG. 5D, resist films 24 for serration are formed in the row direction at intervals equal to the minimum processing size F. These resist films 24 are used as masks to perform second crystallographic anisotropic etching on the surface of the semiconductor substrate, forming V-shaped grooves whose peaks and valleys are alternately and repeatedly arranged in the row direction.

Figure 6:
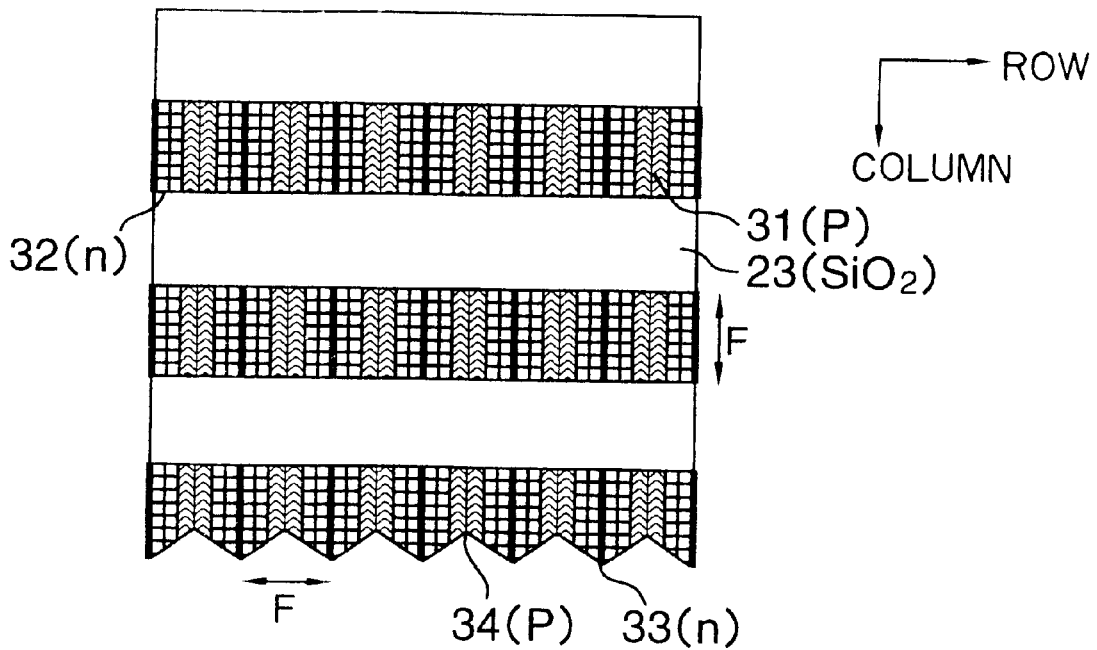
FIG. 6 is a plan view showing a planar structure when the element isolation regions in the column direction are formed by the semiconductor device fabrication method of the embodiment.

Through the above steps, as shown in FIG. 6, a serrated semiconductor substrate can be obtained in which trenched element isolation regions are formed in the column direction and peaks 33 and valleys 34 are alternately arranged in the row direction. In this method, the substrate is serrated after element isolation in the column direction is performed. However, this element isolation in the column direction can also be performed after the substrate is serrated.

After the substrate surface is serrated such that element isolation is performed in the column direction and the valleys 34 and the peaks 33 are arranged in the row direction as shown in FIG. 6, a silicon oxide film 58 is formed on the entire surface by thermal oxidation. In some of these valleys, a metal material is selectively epitaxially grown by using a mask material, or silicon is deposited by epitaxial growth or grapho-epitaxial growth, thereby forming gates 53. Additionally, a silicon oxide film (not shown) is so deposited as to cover the entire surface by CVDS In this structure, the gates 53 are selectively formed in some valleys; A gate 53 formed in each valley and source 52 and a drain 51 made of n-type impurity diffusion layers in peaks on the two sides of the valley form a lateral VMOSFET 55. A valley 59 in which the gate 53 is not formed isolates n-type impurity diffusion layers 42 and 43 in peaks on the two sides of the valley 59. Consequently, V-shaped element isolation layers 59 are formed in the row direction.

Figure 1:
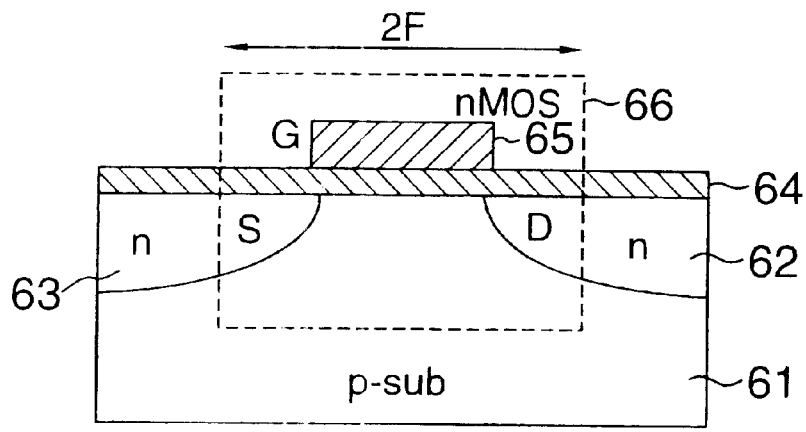
FIG. 1 is a longitudinal sectional view showing the structure of a conventional MOSFET.
Figure 2:
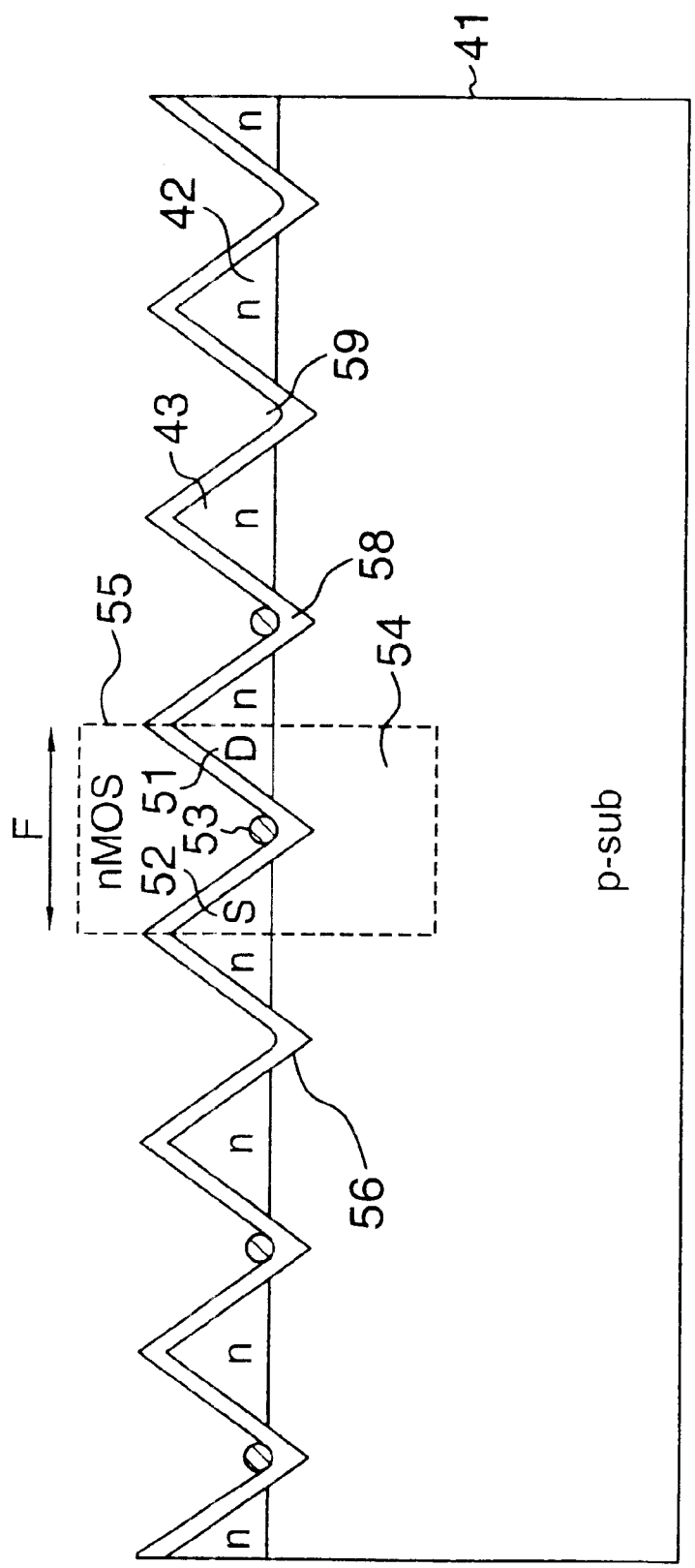
FIG. 2 is a longitudinal sectional view showing a structure in which MosFETs and element isolation regions are selectively formed in a surface portion of a serrated semiconductor substrate according to one embodiment of the present invention.

In this embodiment having the lateral VMOSFETs and the V-shaped element isolation layers, as shown in FIG. 2, one functional element formed has the same size as the minimum processing size F. As described previously with reference to FIG. 1, at least a size of 2F is conventionally necessary to form one functional element. Compared to this, this embodiment can greatly increase the degree of integration.

Also, the above fabrication method can form one transistor by the minimum processing size F regardless of the type of photolithography. Therefore, even when the a minimum processing size F is decreased by using electron rays or X-rays, the degree of integration can be increased by the use of this embodiment.

Furthermore, in the element structure of the above embodiment, impurity diffusion layers in adjacent peaks are isolated by a V-shaped valley between the peaks. Hence, punchthrough can be effectively prevented.

Figure 7:
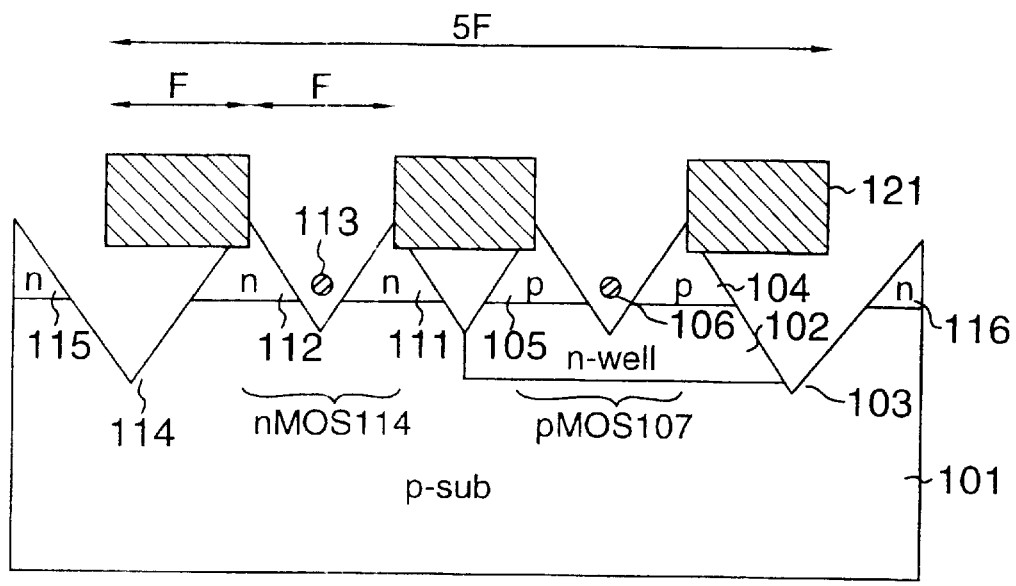
FIG. 7 is a longitudinal sectional view showing a structure when a semiconductor device according to the embodiment of the present invention is applied to a CMos circuit.

FIG. 7 shows the sectional structure of a CMOS circuit formed by combining the lateral VMOSFETs and V-shaped element isolation layers described above. In this structure, the surface of a p-type semiconductor substrate 101 is serrated by the aforementioned procedure to form peaks and valleys. N-type impurity diffusion layers 111 and 112 are formed in peaks, and p-type impurity diffusion layers 104 and 105 are formed on the surface of an n-type well 102. These impurity diffusion layers are isolated by valleys. A gate 113 formed in one valley and the n-type impurity diffusion layers 111 and 112 formed in peaks on the two sides of this valley form an n-type MOS transistor 114. Adjacent to this transistor 114, a gate 106 formed in another valley and the p-type impurity diffusion layers 104 and 105 formed in peaks on the two sides of this valley form a p-type KOS transistor 107. The diffusion layer 111 of the n-type MOS transistor 113 and the diffusion layer 105 of the p-type MS transistor 107 are electrically connected by a metal interconnecting layer 121. The diffusion layer 112 of the n-type MOS transistor 114 and an adjacent diffusion layer 115 are isolated by the valley 114 in which no gate is formed. Analogously, the diffusion layer 104 of the p-type MOS transistor 107 and an adjacent diffusion layer 116 are isolated by a valley 103 in which no gate is formed.

As described above, when this embodiment is applied to a CMOS circuit, it is possible to form a pair of the n-type MOS transistor 114 and the p-type MOS transistor 107 and the valleys 114 and 103 functioning as element isolation regions within a size of 5F.

Figure 8:
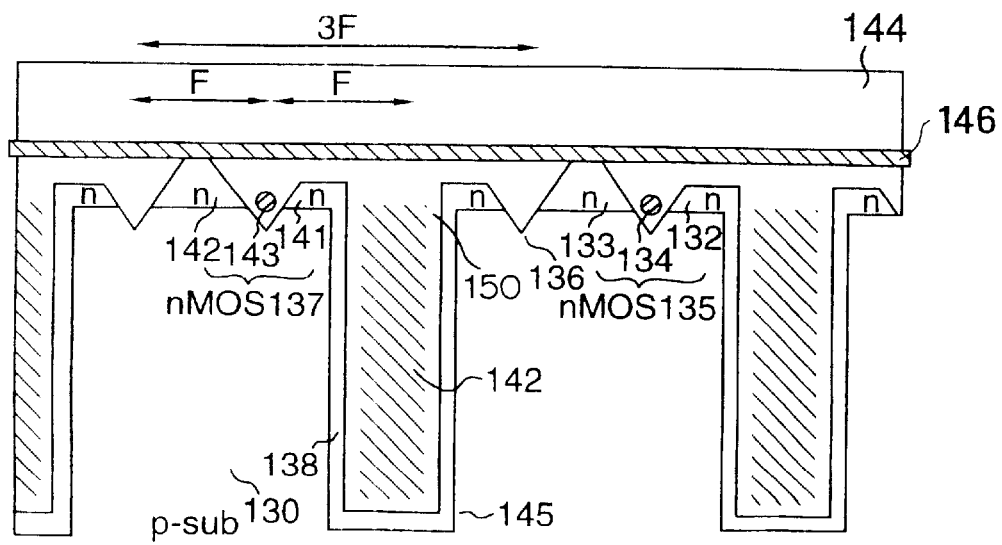
FIG. 8 is a longitudinal sectional view showing a structure when a semiconductor device according to the embodiment of the present invention is applied to a DRAM.

FIG. 8 shows the sectional structure of a DRAM (Dynamic Random Access Memory) circuit formed by combining the aforementioned lateral VMOSFETs and V-shaped element isolation layers. Referring to FIG. 8, the surface of a p-type semiconductor substrate 130 is serrated to form peaks and valleys, N-type impurity diffusion layers 132, 133, 141, and 142 are formed in the peaks and isolated from each other by the valleys. A gate 134 formed in one valley and the n-type impurity diffusion layers 132 and 133 in peaks on the two sides of this valley form an n-type MOS transistor 135. A gate 143 formed in another valley and the n-type impurity diffusion layers 141 and 142 in peaks on the two sides of this valley form an n-type MOS transistor 137. The diffusion layer 133 of the n-type MOS transistor 135 and the diffusion layer 142 of the n-type MOS transistor 137 are connected by a bit line 146. A silicon oxide film 144 is formed on the upper surface of this bit line 146.

A trench 145 is formed as a capacitance between the n-type MOS transistor 135 and the n-type MOS transistor 137. An n-type impurity diffusion layer 138 and a silicon oxide film 150 are formed on the inner surfaces of the this trench 145. Polysilicon 142 is deposited so as to fill up this trench 145. When this embodiment is applied to a DRAM as described above, one MOS transistor, a valley 136 functioning as an element isolation region, and the trench 145 as a capacitance can be formed within a size of 3F A gate contact formation method of this embodiment will be described below. In this embodiment as described above, the substrate surface is serrated at intervals equal to the minimum processing size F, and gates are formed in valleys. Hence, it is dimensionally difficult to directly form a gate contact for the gate formed in a valley. In this embodiment, therefore, gate contacts are formed in portions adjacent to the gates in element isolation regions in the column direction by the following method.

Figure 9:
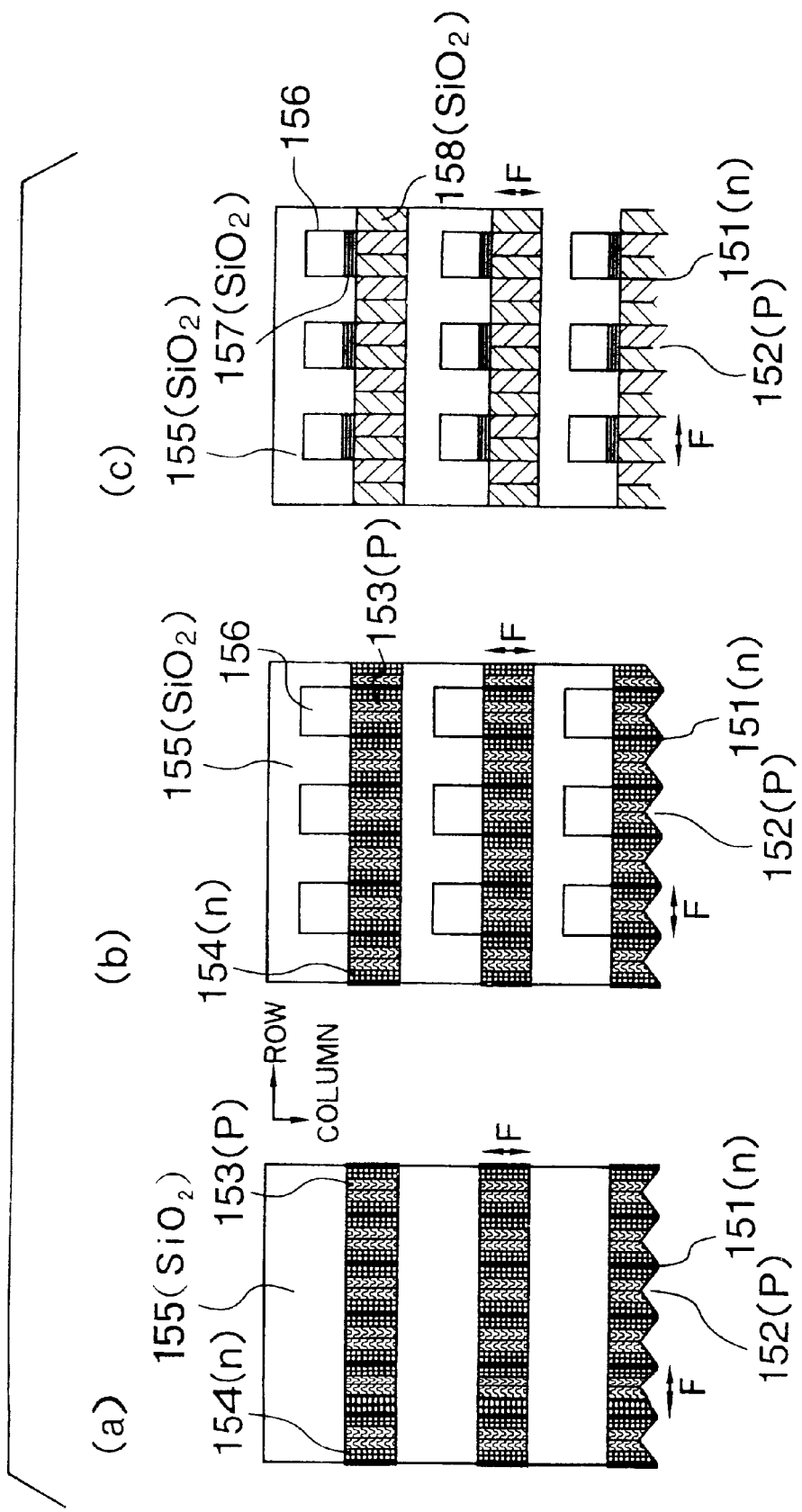
FIGS. 9A to 9C are longitudinal sectional views showing the steps of forming gate contacts by a semiconductor device fabrication method according to the embodiment of the present invention.

FIG. 9A shows the planar structure of an element. The surface of a p-type semiconductor substrate 153 is serrated such that peaks 151 in which n-type impurity diffusion layers 154 are formed and valleys 152 to which the surface of the substrate 153 is exposed are arranged in a row direction. Trenches for isolation in a column direction are formed as element isolation regions. A silicon oxide film 155 is buried in these trenches. As will be described later, these trenches are made much deeper than the valleys 152.

As shown in FIG. 9B, a mask material is selectively formed to form trenches 156 shallower and narrower than the aforementioned trenches in the element isolation regions in which the aforementioned trenches are formed. These trenches 156 are formed adjacent to valleys in which gates are to be formed. Also, the bottom of each trench 156 must be deeper than the bottom surface of the valley 152. Furthermore, the trenches for isolation in the column direction must have an enough depth to allow the silicon oxide film 155 to be well deposited on the bottom surface of the trench 156.

As shown in FIG. 9C, a silicon oxide film 159 is formed by thermal oxidation so as to cover the entire surface of the semiconductor substrate 153 and the impurity diffusion layers 154 except for the element isolation regions in which the silicon oxide film 155 is formed. This silicon oxide film 158 is also formed on a side surface 157 of each trench 156 to which the substrate is exposed.

Figure 10:
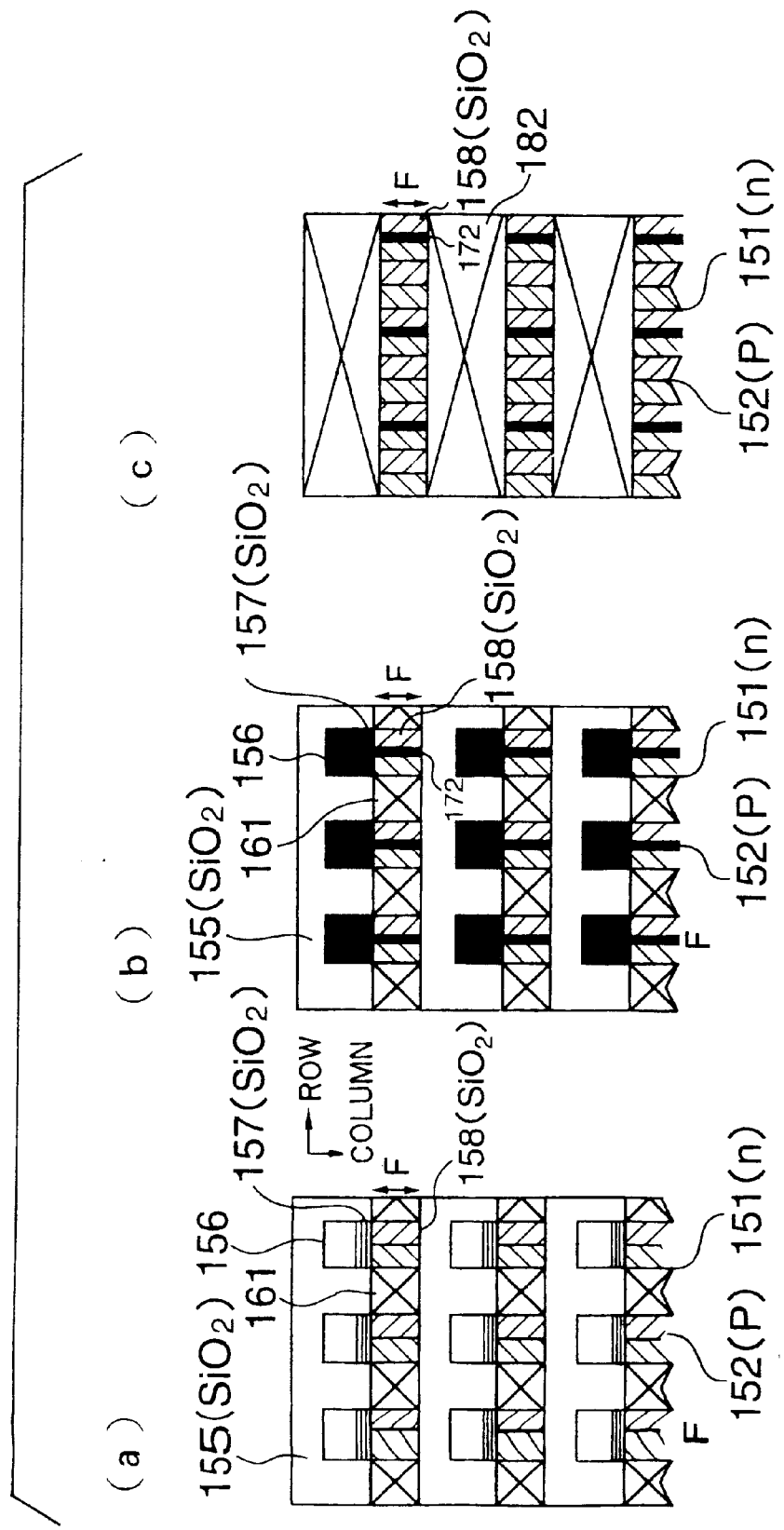
FIGS. 10A to 10C are longitudinal sectional views showing the steps of forming gate contacts by a semiconductor device fabrication method according to the embodiment of the present invention.

As shown in FIG. 10A, some valleys 152 in which no gates are to be formed are covered with a mask material 161 to keep the surface of the silicon oxide film 159 exposed in valleys 152 in which gates are to be formed.

As shown in FIG. 10B, a metal material is deposited by epitaxial growth or silicon is epitaxially grown in the valleys 152 covered with the silicon oxide film 158, thereby selectively forming gates 172 in these valleys 152. Simultaneously, a conductive film made of a metal material or silicon is deposited on the bottom surfaces of trenches 156 adjacent to the gates 172 so as to be connected to the gates 172. After that, the mask material 161 is removed.

As shown in FIG. 10C, a mask material 182 is formed on all element isolation regions for isolation in the column direction.

Figure 11:
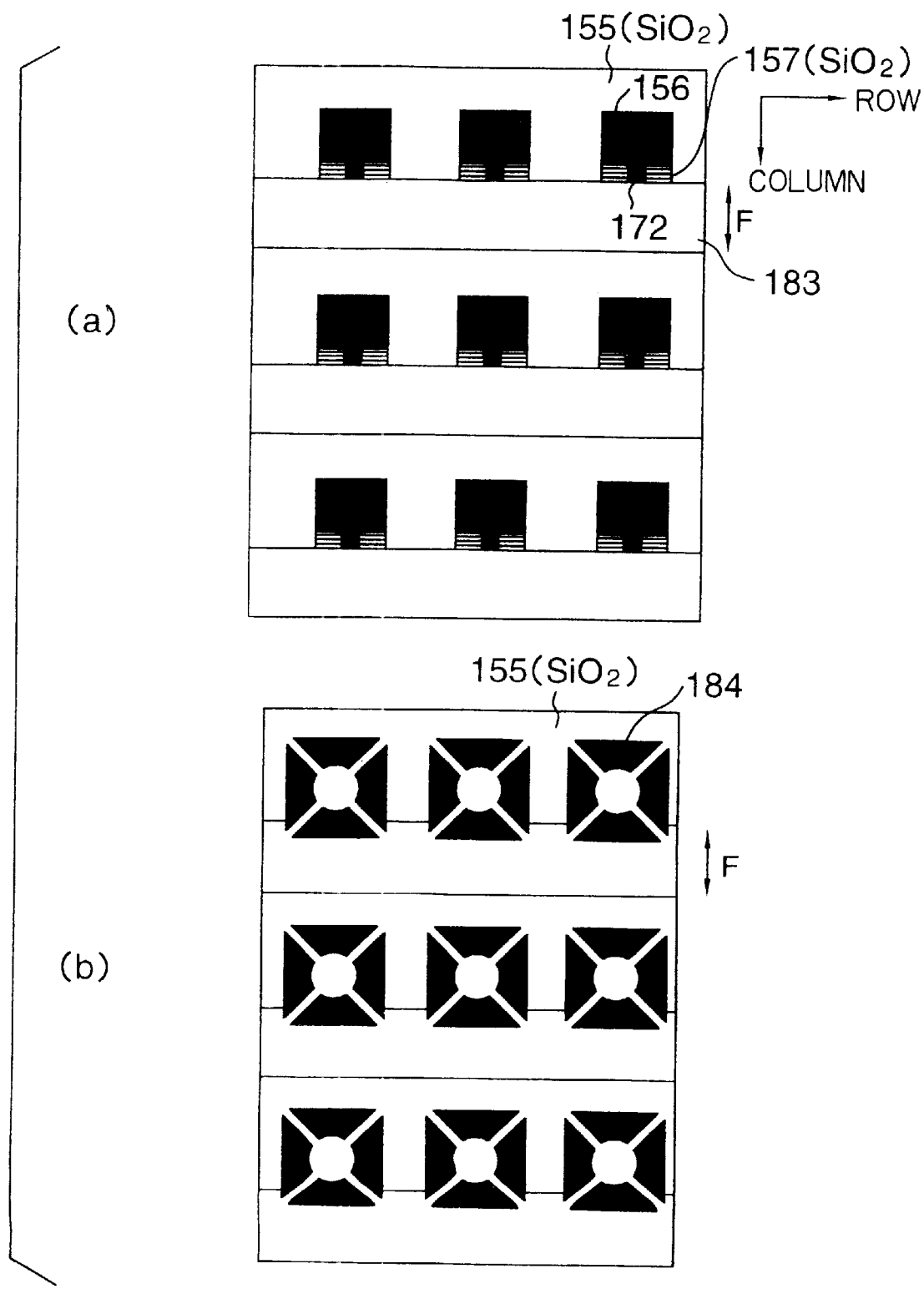
FIGS. 11A and 11B are longitudinal sectional views showing the steps of forming gate contacts by a semiconductor conductor device fabrication method according to the embodiment of the present invention.
Figure 15:
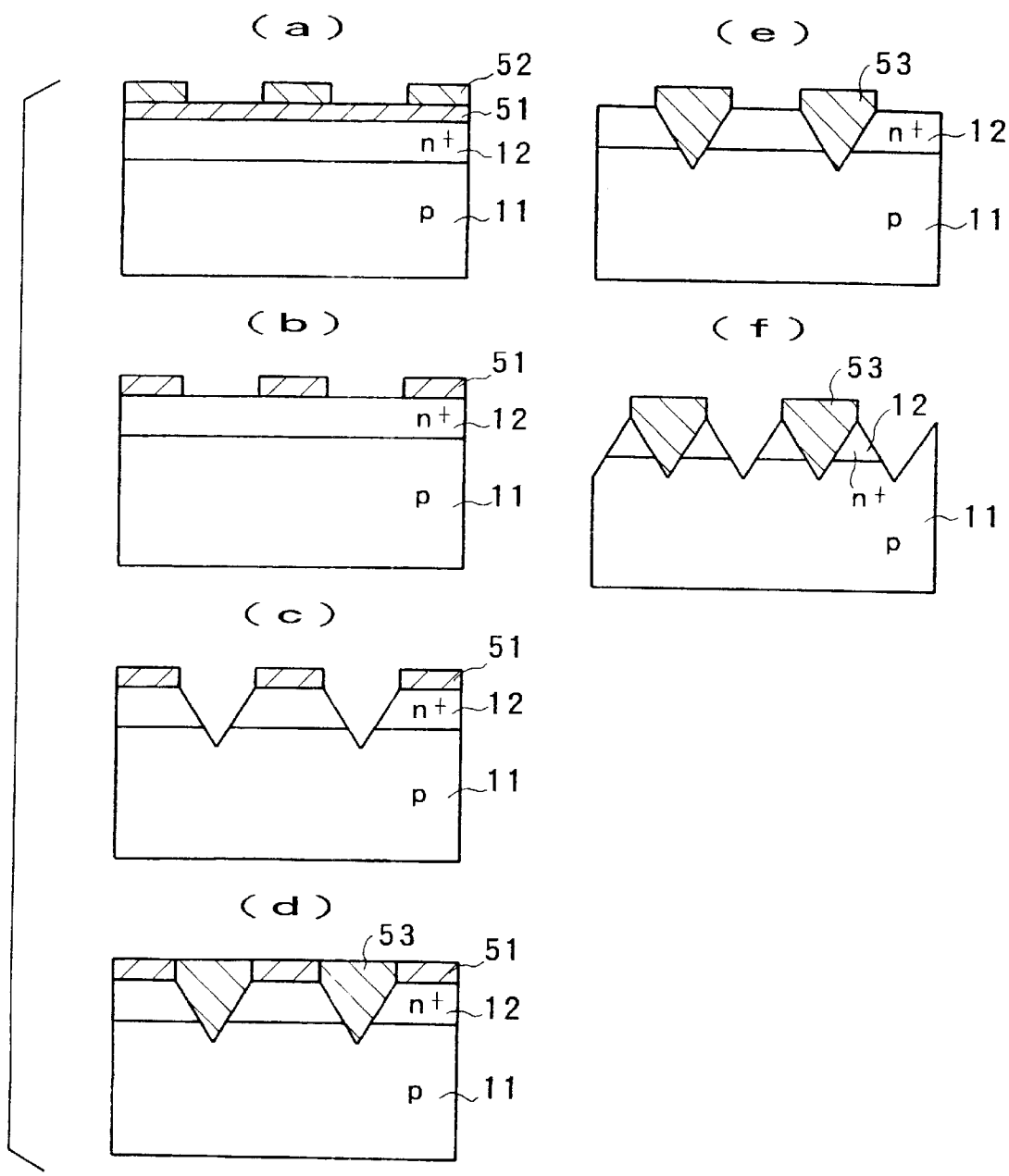
FIGS. 15A to 15F are longitudinal sectional views showing the steps of serrating the surface of a semiconductor substrate before fabrication of the semiconductor memory.
Figure 16:
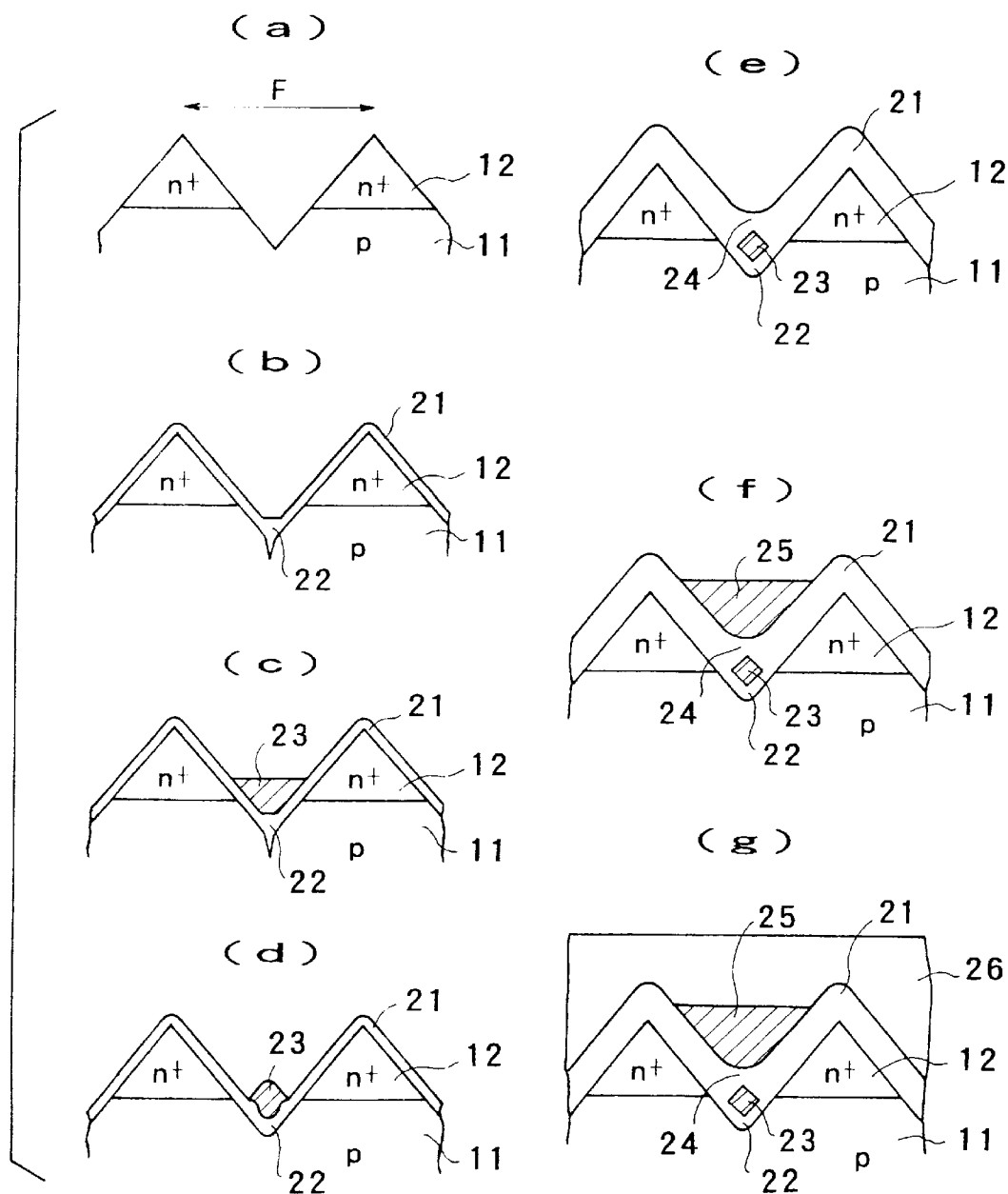
FIGS. 16A to 16G are longitudinal sectional views showing the sectional structures of an element in individual steps in fabricating the semiconductor memory.

As shown in FIG. 11A, a silicon oxide film 183 is deposited by CVD on regions not covered with the mask material 182 to planarite the surface. After that, the mask material 182 covering all element isolation regions for isolation in the column direction is removed.

Subsequently, as shown in FIG. 11B, gate contacts 184 are formed by depositing a conductive material by CVD or the like on the surfaces of the conductive film formed on the bottom surfaces of the trenches 156.

Following the above procedure, in the element isolation regions for isolation in the column direction, the trenches 156 are formed adjacent to the gates 172 formed in the valleys 152. A conductive film is formed on the bottom surfaces of the trenches 156 so as to be connected to the gates 172. The gate contacts 194 are formed on the surface of this conductive film. Therefore, contacts can be formed for the gates 172 formed at intervals equal to the minimum processing size F.

A semiconductor memory of this embodiment has a cell structure as shown in FIG. 12. The surface of a p-type semiconductor substrate 11 is serrated at an interval equal to the minimum processing size F. $N^+$-type impurity diffusion regions 12 are formed in peaks of this serration and separated from each other by a valley. An insulating film 13 with a film thickness ti is formed on the surface of this valley.

A floating gate FG is formed on top of the insulating film 13. The upper portion of this floating gate FG is processed into the shape of a spire.

A tunnel oxide film 14 with a thickness t2 is formed on the floating gate FG, and a control gate CG is formed on the tunnel oxide film 14. The upper portion of the control gate CG and the tunnel oxide film 14 is covered with an insulating film 15. The lower portion of the control gate CG has a shape conforming to the shape of the valley in the semiconductor substrate 11. The end of this lower portion of the control gate CG self-aligns with and opposes the end of the upper spired portion of the floating gate FG. The floating gate FG and the control gate CG are largely different in size; the floating gate FG is much smaller.

This size ratio of the floating gate FG to the control gate CG decreases a capacitive coupling ratio γ (=C2/C1) of a capacitance C1 of the insulating film 13 to a capacitance C2 of the tunnel oxide film 14. As a consequence, even if a control gate voltage Vg to be applied between the substrate 11 and the control gate CG is low, it is possible to cause FN tunneling in the tunnel oxide film 14 between the floating gate 25 and the control gate CG and produce a tunnel current, thereby performing data write or erase.

Also, the surface of the semiconductor substrate 11 is serrated, and the n$^+$-type impurity diffusion regions 12 are formed in peaks of the serration and isolated from each other by a valley. Hence, the source and drain regions formed by the n$^+$-type impurity regions 12 can be formed in one valley. This can make the width of a call substantially the same as F and thereby achieve micropatterning.

In this embodiment, the maximum operating voltage is reduced on the basis of the capacitive coupling ratio of the insulating film 13 to the tunnel oxide film 14. This will be described In detail below with reference to FIG. 13. Assume that the insulating film 13 below the floating gate FG in the valley of the semiconductor substrate 11 is divided into three portions 10, 11, and 12 having capacitances C10, C11 and C12, respectively.

The regions 11 and 12 are parallel-plate MOS capacitors each having an area of s1·W, and their capacitances are represented by $$C11 = C12 = \varepsilon W \frac{s1}{t1} \tag{1}$$

where ε is the dielectric constant of the oxide film, and W is the channel width.

The capacitance C10 of the region 10 takes a finite value unless dielectric breakdown occurs. Therefore, the total capacitance C1 in this valley is given by $$C1 = C11 + C12 + C10 > C11 + C12 = 2\varepsilon W \frac{s1}{t1} \tag{2}$$

On the other hand, the capacitance C2 of the tunnel oxide film above the floating gate FG is represented by $$C2 = \varepsilon W \frac{s2}{t2} \tag{3}$$

Accordingly, the capacitive coupling ratio γ of the capacitance C2 of the tunnel oxide film 14 to the capacitance C1 of the insulating film 13 is $$\gamma = \frac{C2}{C1} = \frac{\varepsilon W s2/t2}{C10 + 2\varepsilon W s1/t1} < \frac{1}{2}\left(\frac{s2}{s1}\right)\left(\frac{t1}{t2}\right) \tag{4}$$

For the sake of simplicity, however, assume that the insulating film 13 and the tunnel oxide film 14 are made of oxide films having the same relative dielectric constant.

To allow data write or erase using the FN tunneling phenomenon between the floating gate FG and the control gate CG as the characteristic feature of this embodiment, a condition represented by inequality (5) below must hold true.

$$3.1(1+\gamma) < VG < 2.7(1+\gamma^{-1}) \tag{5}$$

where all units pertaining to voltages are [V].

In inequality (5) the first and second terms indicate the lower limit of a control voltage VG for causing FN tunneling between the floating gate Fr and the control gate CG. The second and third terms indicate the upper limit of a control voltage VG with which no FN tunneling occurs between the semiconductor substrate 11 and the floating gate FG.

Also, to perform data write or erase by application of a high voltage, inequality (6) below must hold to allow injection or extraction of electrons between the floating gate FG and the control gate CG even if a tunnel current directly flows through the thin insulating film 13 between the substrate and the floating gate PG.

$$\frac{t1}{t2} > \frac{3.6(1+\gamma)}{VG\sqrt{3.6 - VG/(2(1+1+\gamma^{-1}))}} \tag{6}$$

To prevent decrease of the electron injection and extraction rates, an electric field F2 to be applied to the tunnel oxide film 14 must be about $10^9$ [V/m]. Hence, the value F2 obtained by dividing a voltage V2 in this portion by the film thickness t2 of the tunnel oxide film 14 is $$F2 = \frac{V2}{t2} = \frac{VG}{t2(1+\gamma)} = 10^{-1} [V/\text{Å}] \tag{7}$$

wherein all units pertaining to lengths are Å.

Inequality (8) below in derived from inequalities (5) and (7).

$$31 < t2 < \frac{27}{\gamma} \tag{8}$$

Additionally, letting γ be 0 in inequality (6), inequality (9) below is obtained by using inequality (8).

$$t1 > 24 \tag{9}$$

These inequalities (8) and (9) reveal the relation between the film thickness t1 of the insulating film 13, the film thickness t2 of the tunnel oxide film 14, and the capacitive coupling ratio γ.

The relationship between a maximum threshold voltage Vth and the control voltage VG in this embodiment will be described below. The threshold voltage Vth for reading out data after electrons are injected into the floating gate FG must be set so that electrons are not extracted from the floating gate FG by a read voltage higher than Vth.

A voltage V1 applied to the insulating film 13 in a valley of the substrate 11 forms an inversion layer. The threshold value Vth at this time is represented by $$Vth = (1+\gamma^{-1})(0.84 + 0.027 t1 \sqrt{NA} \times 10^{-10}) < VG < 3.1(1+\gamma) \tag{10}$$

where NA is an acceptor impurity density [cm$^{-3}$].

In this equation (10), the first and second terms indicate that the control voltage VG must be higher than the threshold voltage vth. The second and third terms indicate that the control voltage VG must be lower than the voltage which causes FN tunneling when, as described above, data read is performed.

If this is the case, the fabrication process must meet a condition represented by $$t1\sqrt{NA} < (1.1\gamma - 0.3) \times 10^{12} \qquad (11)$$

When the condition indicated by inequality (11) and the condition indicated by inequality (8) are taken into consideration, inequality (12) below must hold.

$$t1\sqrt{NA} < 6.6 \times 10 \qquad (12)$$

Letting NA be $10^{17}$ [cm$^{-3}$], t1<2,100 Å. Since the film thickness t1 of the insulating film 13 in an actual cell takes a much smaller value than 2,100 Å, it is almost unnecessary to take this condition into consideration.

The upper limit of a film thickness ratio t2/t1 of the film thickness t1 of the insulating film 13 to the film thickness t2 of the tunnel oxide film 14 will be described below by using inequality (6) with reference to FIG. 14. As is apparent from FIG. 14, the upper bound of this film thickness ratio t2/t1 monotonously increases with respect to a reciprocal $1/\gamma$ of the capacitive coupling ratio. Also, the upper bound film thickness ratio t2/t1 monotonously increases with respect to the control gate voltage VG within the range of 3 to 10 [V].

In the range shown in FIG. 14, the film thickness ratio t2/t1 always takes a value of 0.5 or more. As a practical example of a cell, therefore, assume that the film thickness t1 of the insulating film 13 is 100 Å, the film thickness t2 of the tunnel oxide film 14 is 50 Å, and s1 is twice as large as s2. If this is the case, inequality (13) below can be derived from inequality (8).

$$\gamma^{-1} > s1/s2 > 2 \qquad (13)$$

This inequality (13) and aforementioned inequality (5) show that the control gate voltage VG represented by inequality (14) below is necessary in data write or erase.

$$4.5 < VG < 8.1 \qquad (14)$$

As indicated by this inequality (14), in this embodiment, the voltage to be applied between the substrate and the control gate can be greatly reduced to 4.5 to 8.1 [V] compared to that in conventional devices.

A semiconductor memory fabrication method according to this embodiment will be described below with reference to FIGS. 15A to 16G.

First, a procedure of serrating the surface of a semiconductor substrate will be described with reference to FIGS. 15A to 15F. As shown in FIG. 15A, an n-type impurity diffusion layer 12 is formed on the (100) surface of a p-type semiconductor substrate 11. That is, a silicon oxide film or a silicon nitride film is formed on the surface of the substrate 11 while an n-type impurity is doped. Alternatively, the impurity is ion-implanted after the film formation. After that, the impurity in the silicon oxide film or silicon nitride film is thermally diffused into the surface of the semiconductor substrate 11. A silicon nitride film 51 is formed as a mask material on the n-type impurity diffusion layer 12 by CVD. A resist film 52 patterned into a predetermined shape is formed on the silicon nitride film 51.

As shown in FIG. 15B, the silicon nitride film 51 is etched by using the resist film 52. The resultant silicon nitride film 51 is used as a mask to perform crystallographic surface anisotropic etching (LSI Handbook, The OHM-Sha, Ltd., pages 264 and 265) on the semiconductor substrate 11, thereby forming V-shaped grooves so that the (111) surface is exposed. In this step, the depth of the grooves and the depth of the impurity diffusion layer 12 must be so set that the surface of the semiconductor substrate 11 is exposed to the bottom surfaces of the grooves.

As shown in FIG. 15D, a silicon oxide film 53 is buried in the grooves by CVD. After that, the silicon nitride film 51 is removed as shown in FIG. 15E.

The silicon oxide film 53 is used as a mask to again perform crystallographic plane anisotropic etching on the semiconductor substrate 11, forming V-shaped grooves as shown in FIG. 15F. Through these steps, the surface of the semiconductor substrate 11 is so serrated that the n$^+$-type impurity diffusion layers 12 are formed in peaks and isolated from each other by valleys.

Next, a procedure of forming a floating gate and a control gate in a valley will be described below with reference to FIGS. 16A to 16G. As shown in FIG. 16A, the surface of the semiconductor substrate 11 is serrated at intervals equal to the minimum processing size F. Radical oxidation is performed on the surface of the semiconductor substrate 11 to form a thin silicon oxide film 21 as shown in FIG. 16B. Tn this step, the oxidizer concentrates in a valley 22 of the semiconductor substrate 11, so a portion of the silicon oxide film 21 in this valley 22 is thicker than its other portion.

As shown in FIG. 16C, grapho-epitaxial growth is performed to form a crystalline silicon floating gate 23 on the surface of the silicon oxide film 21 in the valley. Since the silicon forming this floating gate 23 is epitaxial, the state of interface of the floating gate 23 is better than that of a floating gate made of conventional polysilicon.

Radical oxidation is again performed. Consequently, as shown in FIG. 16D, the upper surface of the floating gate 23 is processed into the shape of a spire because the oxidation rate of the (111) surface of the substrate 11 exposed to the bottom surface of the valley is high. Also, the oxidizer does not concentrate in the lower portion of the floating gate 23. Therefore, the progress of oxidation is slower than in other portions, with the result that the valley is rounded.

As shown in FIG. 16K, the oxidation further proceeds to form silicon oxide film 24 so as to cover the surface of the floating gate 23 and the surface of the silicon oxide film 21.

As shown in FIG. 16F, grapho-epitaxial growth is again performed on the floating gate 23 via the silicon oxide film 24 to form a control gate 25. The lower portion of the control gate 25 thus formed has a shape conforming to the shape of the valley. The end of this lower portion self-aligns with and opposes the upper spired portion of the floating gate 23. After that, as shown in FIG. 16G, a silicon oxide film 26 is deposited on the entire surface by CVD. Through these steps, a semiconductor memory according to this embodiment can be fabricated.

Figure 17:
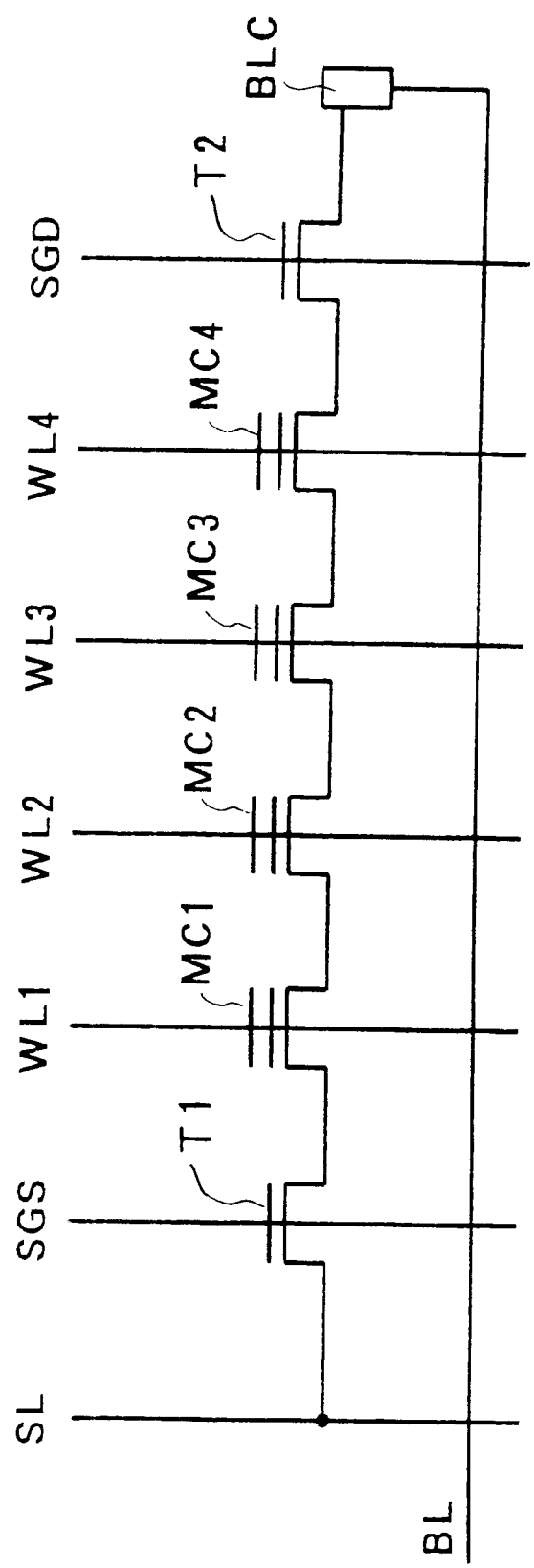
FIG. 17 is a circuit diagram showing the configuration of a NAND $E^2$PROM.

A circuit in which the semiconductor memory of this embodiment is applied to a RAND EEPROM will be described below. FIG. 17 shows the circuit configuration. One terminal of a selector gate transistor T1 on the source side is connected to a selecting line SL. The other terminal of this transistor T1, both terminals of each of memory cells MC1 to MC4 having a floating gate and a control gate, and one terminal of a selector gate transistor T2 on the drain side are connected in series. The other terminal of the transistor T2 is connected to a bit line BL via a bit line contact BLC. A selector gate line SGS is connected to the selector gate of the transistor T1. Word lines WL1 to WL4 are connected to the control gates of the memory cells MC1 to MC4, respectively. A selector gate line SGD is connected to the selector gate of the transistor T2.

Figure 18:
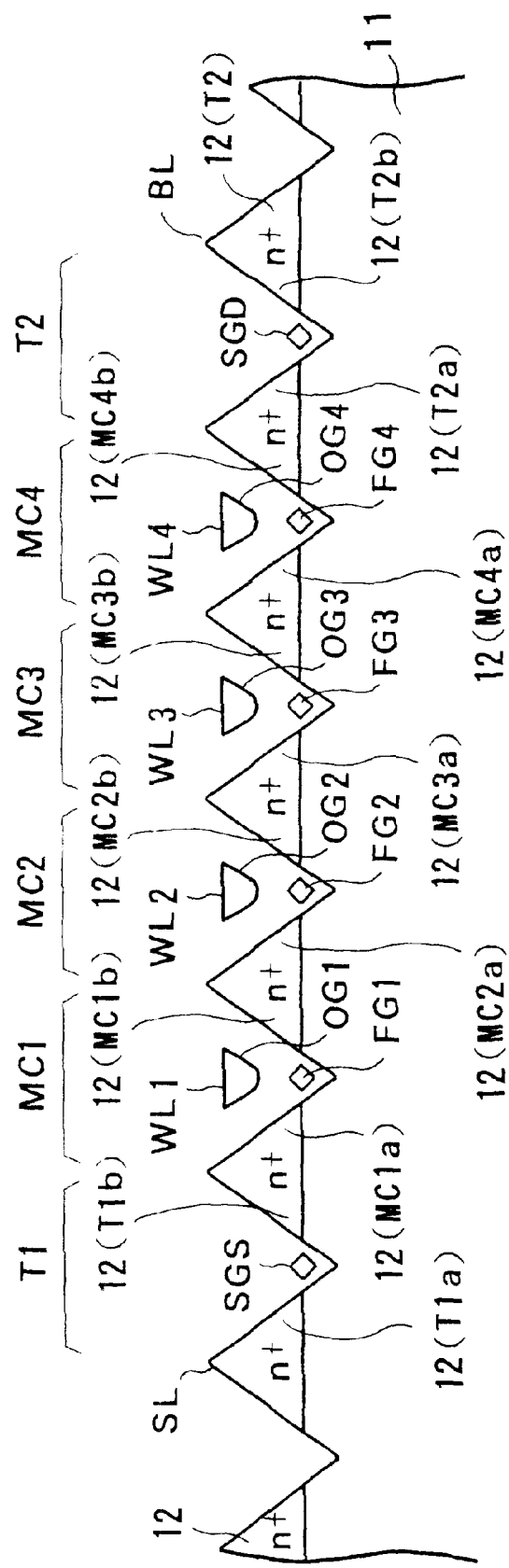
FIG. 18 is a longitudinal sectional view showing a sectional structure when this embodiment is applied to the NAND $E^2$PROM.

When the semiconductor memory of this embodiment is applied to the KMAD EEPROM with the above circuit configuration, a sectional shape as shown in FIG. 18 is obtained. Referring to FIG. 18, the surface of the p-type semiconductor substrate 11 is serrated, and the n-type impurity region 12 is formed in each peak. The transistor T1, the memory cells MC1 to MC4, and the transistor T2 are formed in units of six adjacent valleys in the semiconductor substrate 11. The transistor T1 has the selector gate SGS in its valley. The memory cells MC1 to MC4 have floating gates FG1 to FG4 and control gates CG1 to CG4, respectively, in their valleys. The transistor T2 has the selector gate SGD in its valley. An n-type impurity region 12 (T1a) corresponding to one terminal of the transistor T1 is connected to the selecting line SL. An n-type impurity region 12 (T2b) corresponding to one terminal of the transistor T2 is connected to the bit Line BL.

An n-type impurity region 12 (T1b) corresponding to the other terminal of the transistor T1 and one n-type impurity region 12 (MC1a) of the memory cell MC1 share the same peak. The other n-type impurity region 12 (MC1b) of the memory cell MC1 and one n-type impurity region 12 (MC2a) of the memory cell MC2 share the same peak, The other a-type impurity region 12 (MC2b) of the memory cell MC2 and one n-type impurity region 12 (MC3a) of the memory cell MC3 share the same peak. The other n-type impurity region 12 (MC3b) of the memory cell MC3 and one n-type impurity region 12 (MC4a) of the memory cell MC4 share the same peak. The other n-type impurity region 12 (MC4b) of the memory cell MC4 and an n-type impurity region 12 (T2a) corresponding to the other terminal of the transistor T2 share the same peak.

The selector gate SGS of the transistor T1 and the selector gate SGD of the transistor T2 can be formed in the same formation step as for the floating gates PG1 to FG4 of the memory cell transistors Me1 to MC4 or the same formation step as for the control gates CG1 to CC4 of the memory cell transistors MC1 to MC4.

When this embodiment is applied to a NAND EEPROM as described above, the transistors T1 and T2 and the memory cells MC1 to MC4 can be continuously formed in units of valleys in a serrated semiconductor substrate. Accordingly, the degree of integration can be increased, and the impurity regions 12 can be easily isolated by using the valleys.

The cell area and the maximum internal voltage in each of four different kinds of cell array types of flash memories when the above embodiment is applied will be described below.

FIG. 19 shows the array structure, bit line contact, merits, and the like of these cell types (NOR, imaginary ground, AND, and NAMD types).

Figure 21:
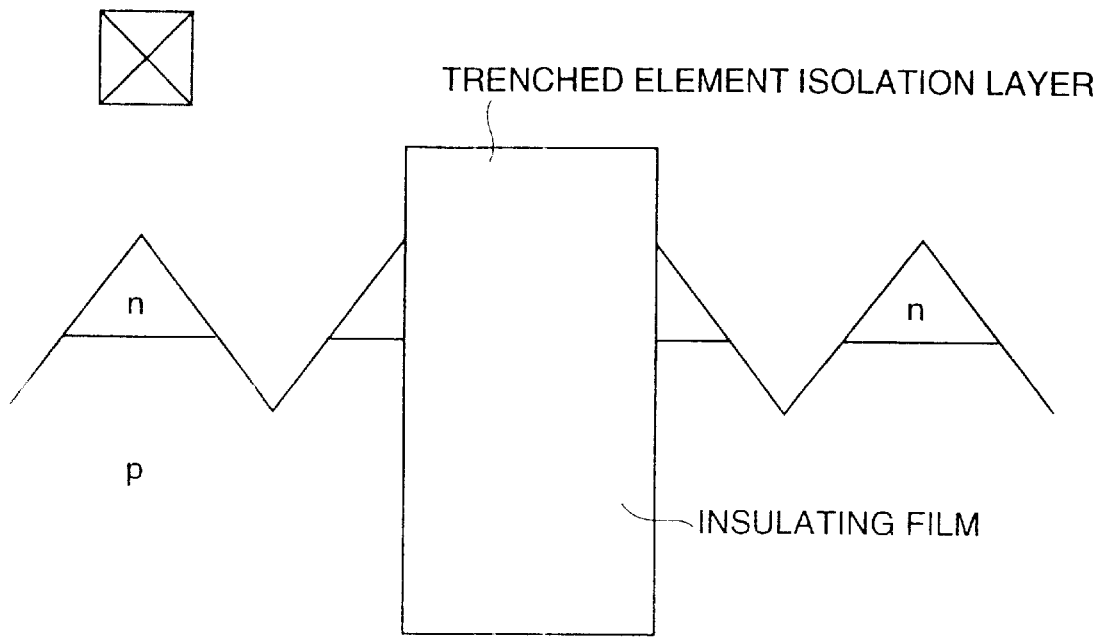
Figure 22:
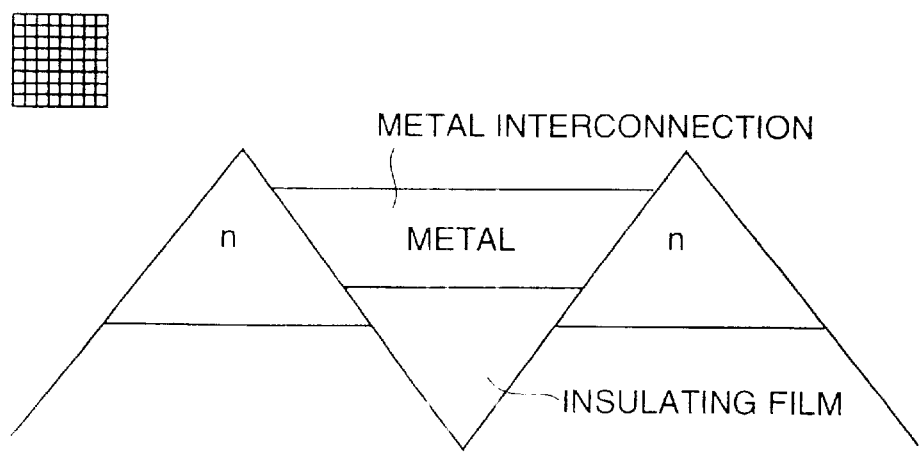

FIGS. 27 to 30 show the plane structures of elements of these cell types- Symbols used in FIGS. 27 to 30 are as shown in FIGS. 20 to 22.

FIG. 20 shows symbols of gate contacts. An arrow of each symbol indicates that a gate exists near the arrow-head. A double gate transistor is a transistor having both a floating and control gates as explained with reference to, e.g., FIGS. 12 and 13, and this gate is used in a nonvolatile memory cell. A single gate transistor is a common transistor having no floating gate and used in a selector gate or the like.

An insulating film such as a silicon oxide film is buried in a trenched element isolation layer shown in FIG. 21.

A metal interconnection shown in FIG. 22 is an interconnecting layer made of, e.g., aluminum or a refractory metal. In this embodiment, the metal interconnection is formed in a valley via an insulating film.

Figure 23:
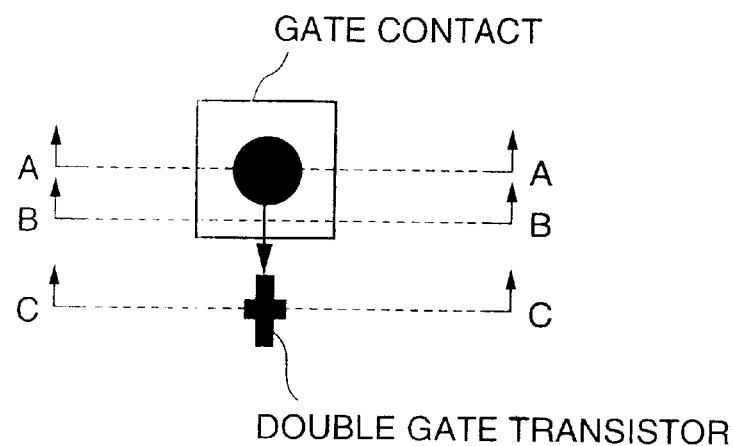
FIG. 23 is a view for explaining symbols indicating connection between a gate contact and a transistor gate.
Figure 24:
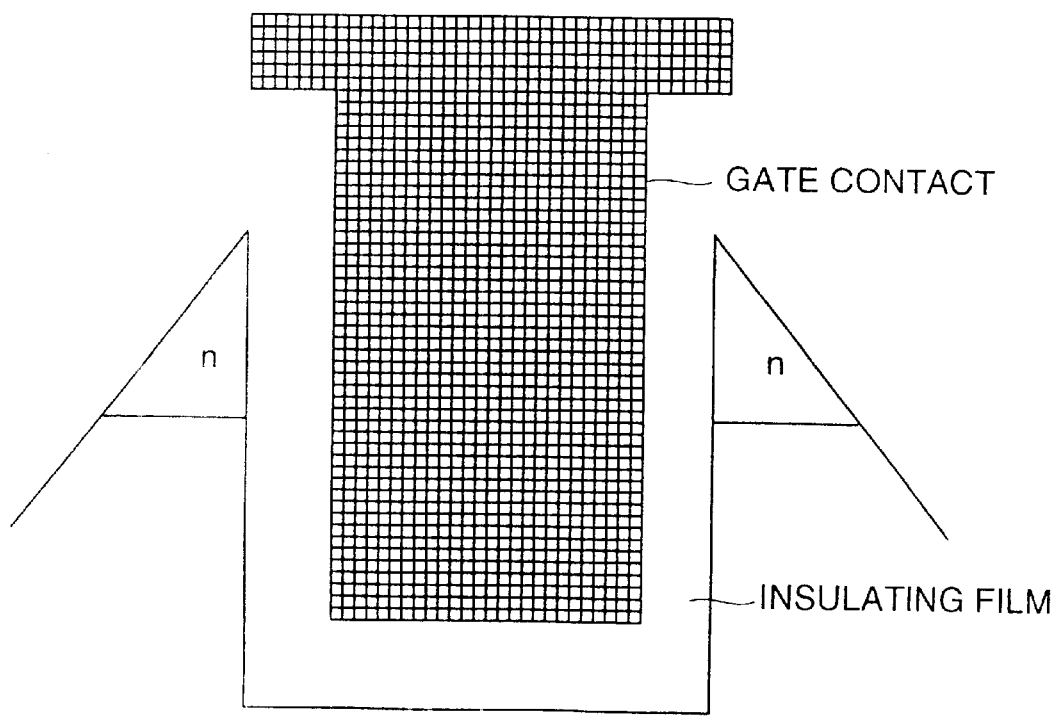
FIG. 24 is a longitudinal sectional view taken along a line A—A in FIG. 23.
Figure 25:
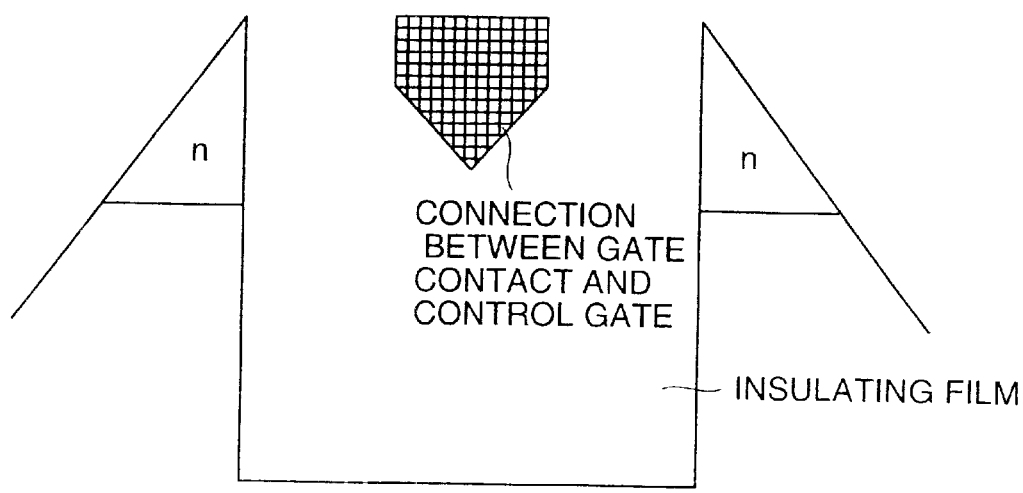
FIG. 25 is a longitudinal sectional view taken along a line B—B in FIG. 23.
Figure 26:
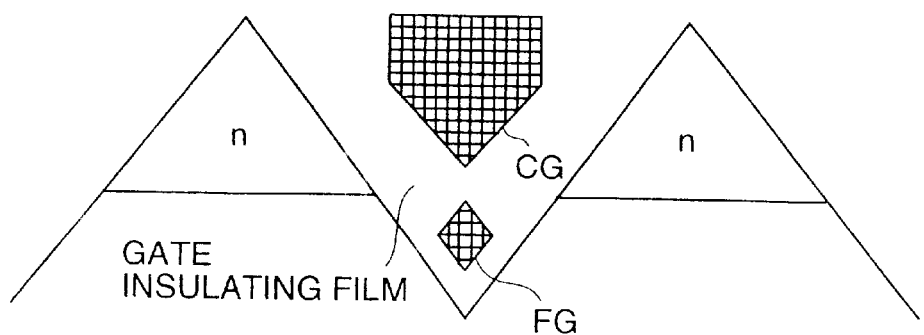
FIG. 26 is a longitudinal sectional view taken along a line C—C in FIG. 23.

FIG. 23 shows symbols indicating a gate of one transistor and connection to a gate contact connected to the gate. FIGS. 24, 25, and 26 are longitudinal sectional views taken along lines A—A, B—B, and C—C, respectively, in FIG. 23. As shown in FIG. 26, this transistor is a double gate transistor and has a floating gate FG and a control gate CG. As shown in FIG. 23, a gate contact is formed apart from the control gate. This gate contact and the control gate are connected as shown in FIG. 25.

FIGS. 27 to 30 show NAND, AND, NOR, and imaginary ground cell array structures by using these symbols.

Figure 27:
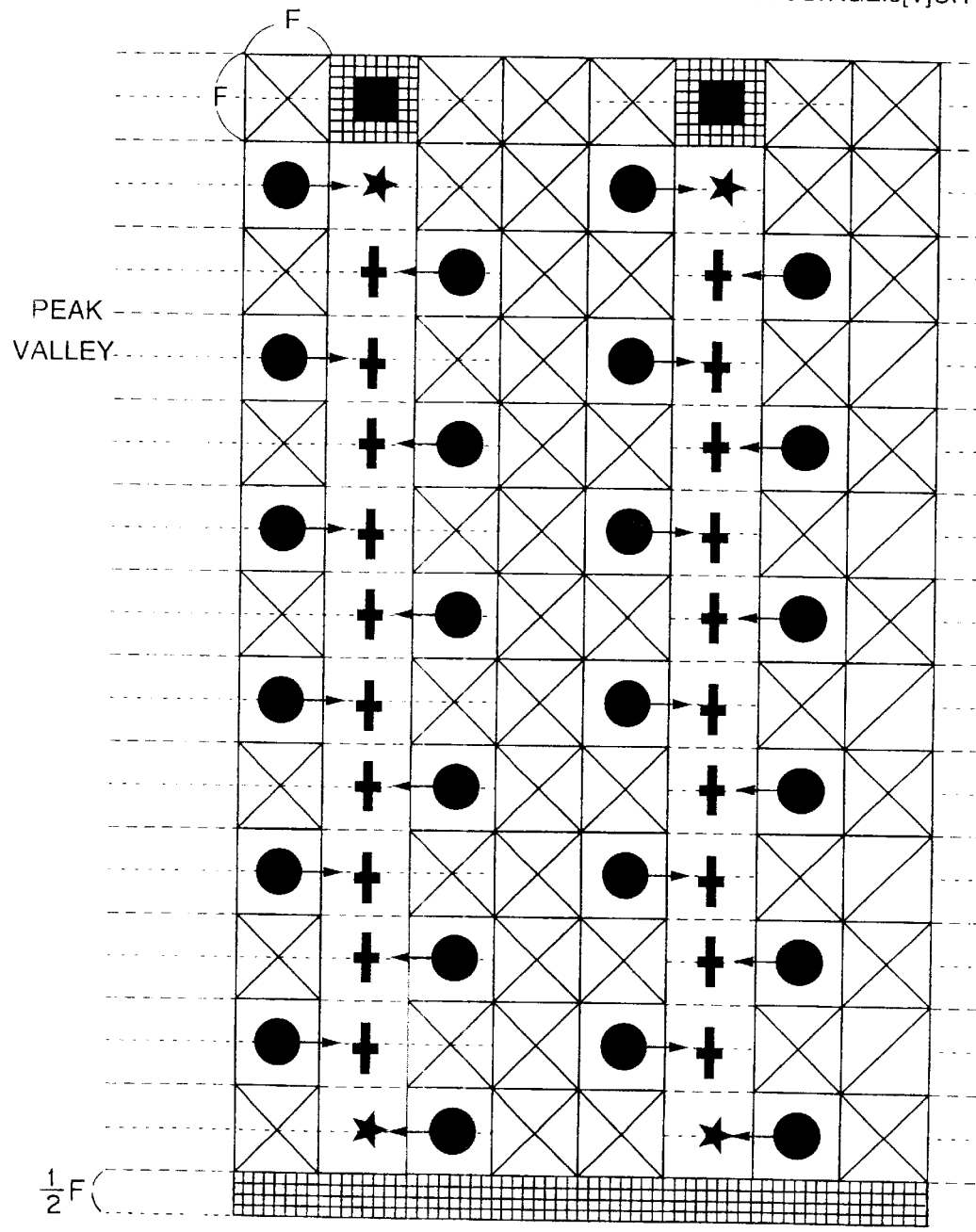
FIG. 27 is a plan view showing the layout of a cell array in a NAND flash memory.

The NAND cell structure shown in FIG. 27 has 10×2 double gate transistors, 2×2 single gate transistors, and two bit line contacts. Further, 4(=8×½) metalic squares are required as a source line, which is shared by another cell array formed in the lower of FIG. 27 in anti-vertical direction. Therefore, 108 (=8×13+8×½) squares each having an area of F×F exist, so the area is 108F$^2$. Since the number of memory cells is 20, the area of one cell is 5.4F$^2$. In this structure the maximum internal voltage is 8 V or less.

Figure 28:
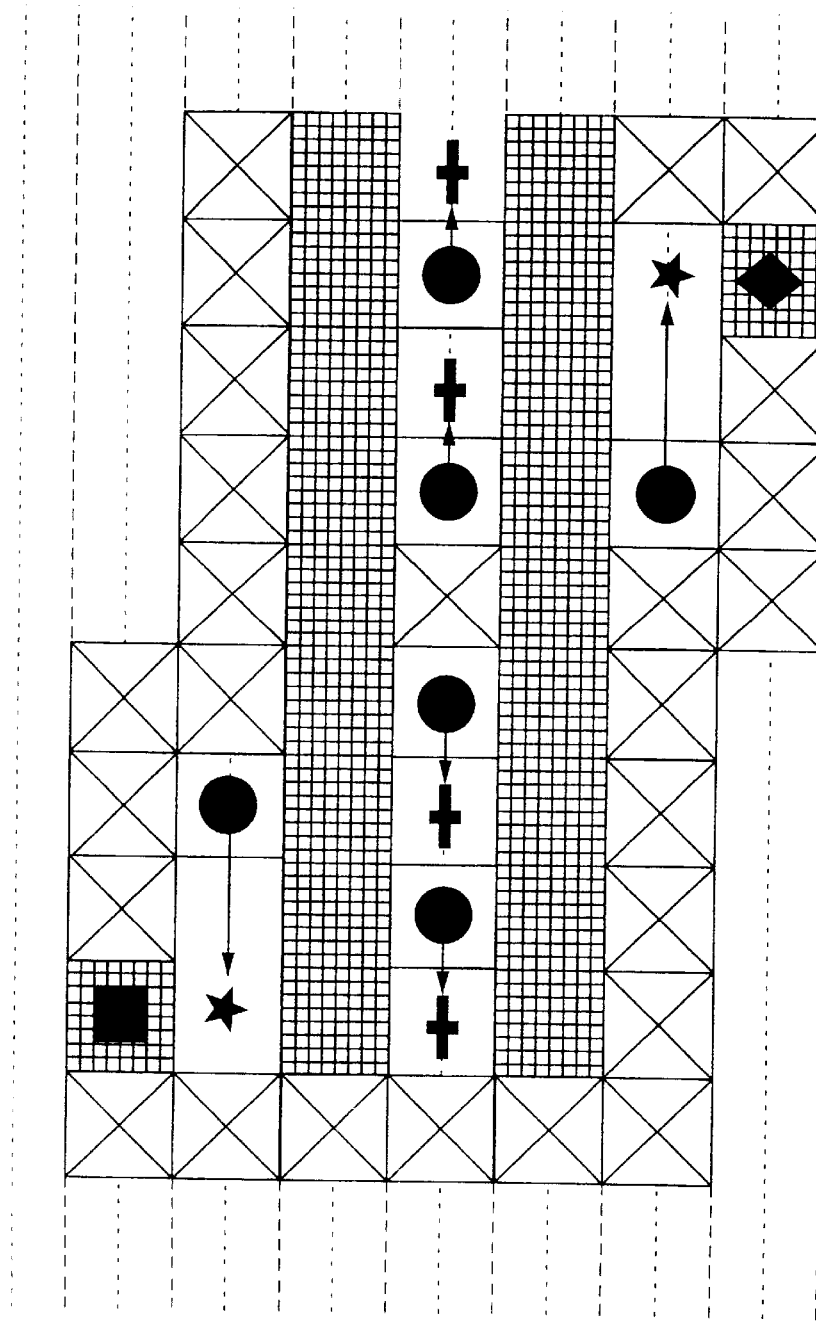
FIG. 28 is a plan view showing the layout of a cell array in an AND flash memory.

The AND cell structure shown in FIG. 28 has four double gate transistor memory cells, two single gate transistors, one bit line contact, and one source line contact. In this structure, the area of one cell is 15 (=60/4)F$^2$, and the maximum internal voltage is 8 V or less.

Figure 29:
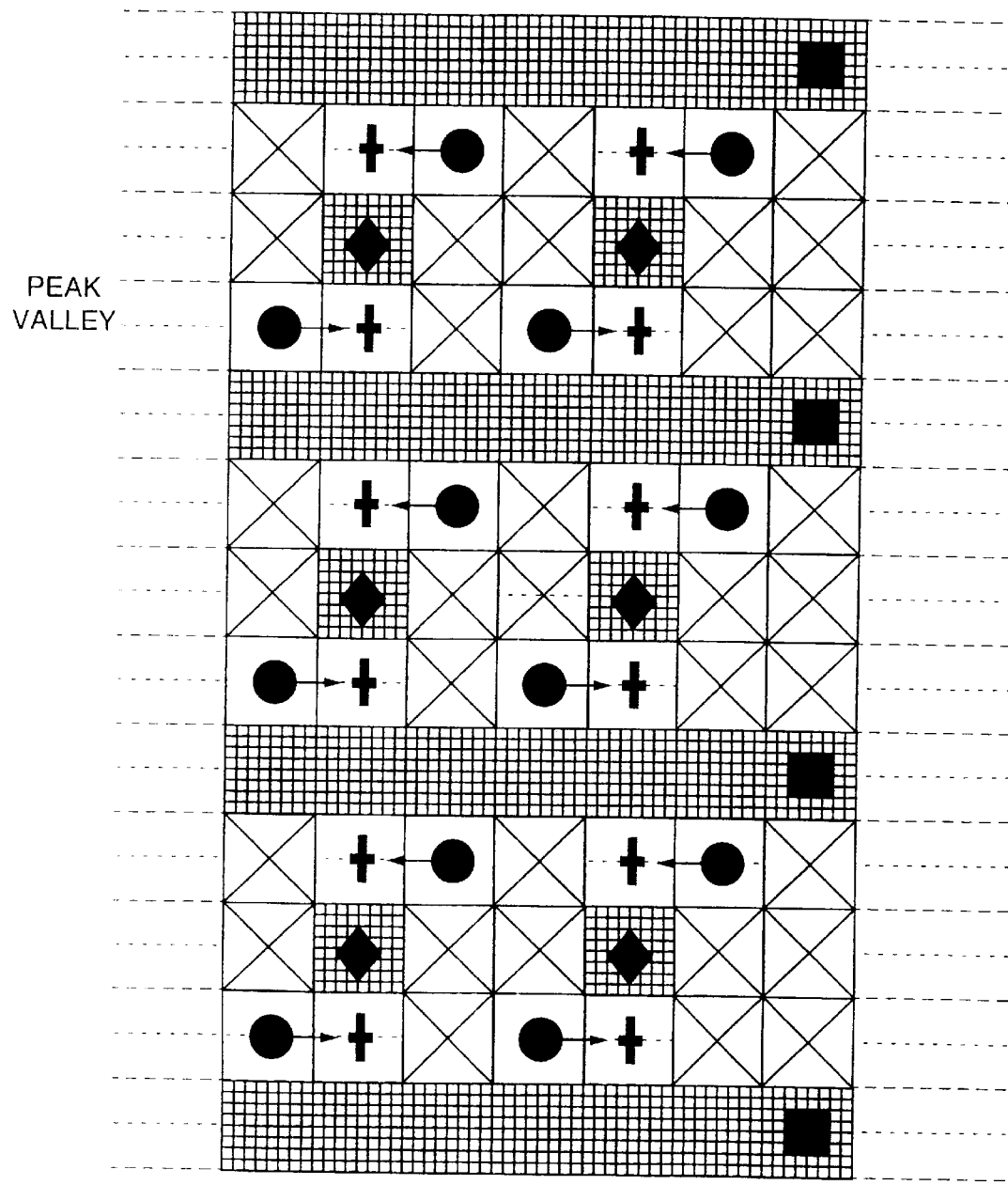
FIG. 29 is a plan view showing the layout of a cell array in a NOR flash memory.

The NOR cell structure shown in FIG. 29 has 12 double gate transistor memory cells, six bit line contacts, and four source line contacts. The area of one cell is 7 (=56/8)F$^2$, and the maximum internal voltage is 8 V or less.

Figure 30:
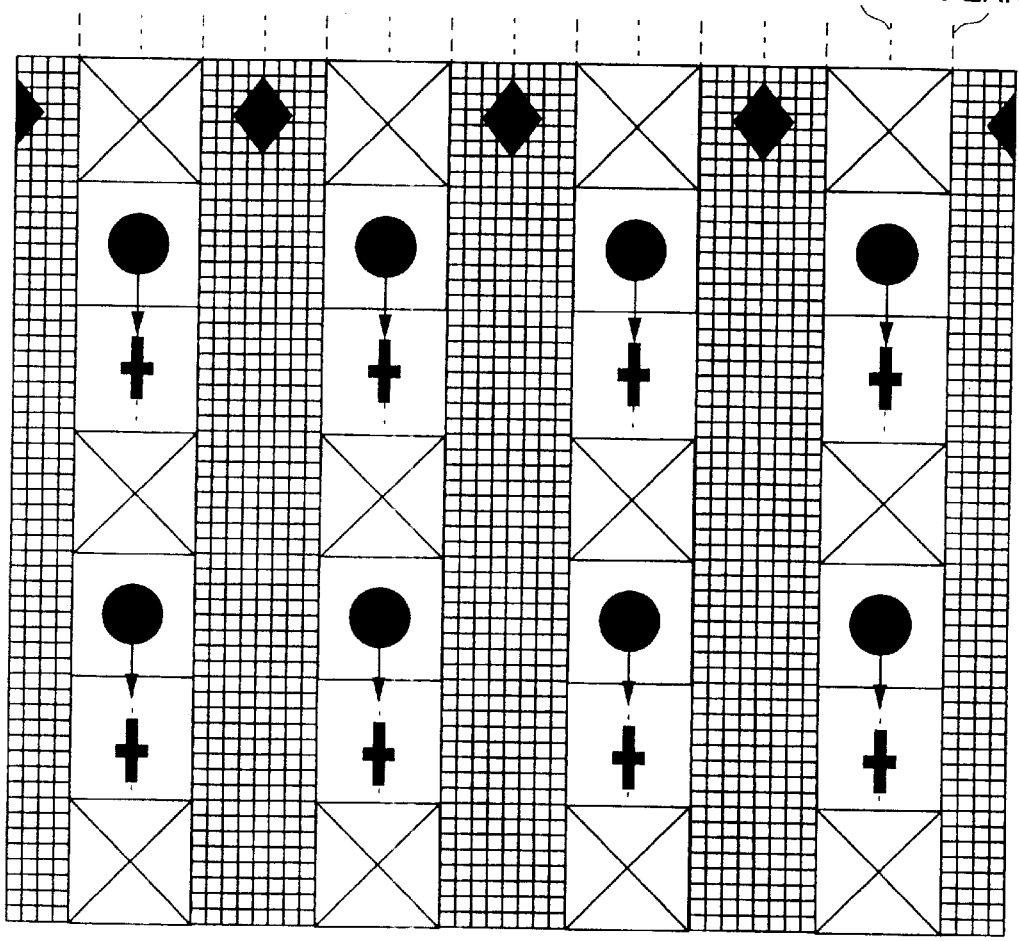
FIG. 30 is a plan view showing the layout of a cell array in an imaginary ground type HAND flash memory.

The imaginary ground cell structure shown in FIG. 30 has eight double gate transistor memory cells, and four bit line contacts. The area of one cell is 7 (=56/8)F$^2$, and the maximum internal voltage is 8 V or less.

From the foregoing, it is found that the cell area reducing effect of this embodiment is largest in the NAND cell structure; the cell area is 5.4F$^2$.

The above embodiment is merely an example and does not restrict the present invention. For example, the various fabrication conditions, film thicknesses, and materials, in the fabrication method of the embodiment are examples and hence can be changed where necessary. Also, the semiconductor memory of the present invention can be applied to various memories, as well as to a NAND EEPROM.

Finally, table 1 shows a comparison to conventional examples. It is found that both smallest area per unit cell and lowest maximum voltage used inside are achieved at the same time.

TABLE 1

| | | NOR | Imaginary Ground | AND | NAND |
|---|---|---|---|---|---|
| Area per unit cell [F$^2$] | Conventional | 9.5–11.5 | — | 6.6–8.5 | 5.5–8.6 |
| | Present Invention | 7 | 7 | 15 | 5.4 |
| Inside-use Maximum Voltage [V] | Conventional | 12 | — | 16 | 18 |
| | Present Invention | 4.5–8.1 | 4.5–8.1 | 5.5–8.1 | 4.5–8.1 |

What is claimed is:

1. A semiconductor device comprising, on a serrated substrate whose peaks and valleys alternately formed in the row direction of the surface extend in a column direction of the surface:

a functional element including a thin linear gate formed to extend in the column direction in a valley via an insulating film and a source and a drain formed respectively in two peaks on two sides of the valley in which said gate is formed; and a row-direction element isolation layer selectively formed in a valley by burying an insulating substance in the valley without forming said gate, said row-direction element isolation layer electrically isolating two functional elements or impurity diffusion layers arranged on two sides of the valley in the row direction.

2. A device according to claim 1, wherein said functional element comprises:

a first-conductivity type functional element including impurity diffusion layers of a first conductivity type formed in first and second adjacent peaks, a second-conductivity type region in a first valley between the first and second peaks, and a first thin linear gate formed in the first valley in the column direction via said insulating film; and a second-conductivity type functional element including impurity diffusion layers of a second conductivity type formed in third and fourth adjacent peaks, a region of the first conductivity type in a second valley between the third and fourth peaks, and a second thin linear gate formed in the second valley in the column direction via said insulating film.

3. A device according to claim 1, further comprising, on said serrated substrate, a column-direction element isolation layer formed by burying an insulating substance in a trench linearly extending in the row direction and deeper than the valleys.

4. A device according to claim 1, wherein a direction in which a driving current flows in said functional element is the row direction of said serrated substrate to increase the driving current and reduce an occupied area of said functional element.

5. A semiconductor device comprising:

a semiconductor substrate having peaks and valleys formed by serrating a surface of said semiconductor substrate;

floating gates formed in the valleys of said semiconductor substrate via a first insulating film and having an upper spired portion; and control gates formed on said floating gates in the valleys of said semiconductor substrate via a second insulating film and having a lower portion with a shape conforming to the valley, wherein an upper end portion of said floating gate and a lower end portion of said control gate oppose each other via said second insulating film.

6. A device according to claim 5, wherein electrons are injected into said floating gate or injected electrons are extracted from said floating gate by generating a tunnel current between said floating gate and said control gate via said second insulating film.

7. A device according to claim 5, wherein a capacitive coupling ratio of a first capacitance formed by said semiconductor substrate, said first insulating film, and said floating gate to a second capacitance formed by said floating gate, said second insulating film, and said control gate is set by a ratio of a size of a bottom surface of said floating gate to a size of a bottom surface of said control gate.

8. A NAND nonvolatile semiconductor device in which one terminal of a first transistor having a selector gate, both terminals of each of at least two memory cell transistors each having a floating gate and a control gate, and one terminal of a second transistor having a selector gate are connected in series, the other terminal of said first transistor is connected to a selecting line, and the other terminal of said second transistor is connected to a bit line, wherein on a semiconductor substrate having peaks and valleys formed by serrating a surface of said semiconductor substrate, impurity diffusion layers being formed in the peaks and isolated from each other by the valleys, said first transistor has a selector gate formed in a valley via a first insulating film or first and second insulating films and impurity diffusion layers formed in peaks on two sides of the valley, at least said two memory cell transistors have floating gates formed via said first insulating film in at least two continuous valleys adjacent to the valley in which said selector gate of said first transistor is formed and having an upper spired portion, control gates formed on said floating gates to oppose said floating gates via said second insulating film, and impurity diffusion layers formed in peaks on two sides of each valley, said second transistor has a selector gate formed via said first insulating film or said first and second insulating films in a valley adjacent to at least said two continuous valleys in which said floating gates of said memory cell transistors are formed, and impurity diffusion layers formed in peaks on two sides of the valley, and one of said two impurity diffusion layers of said first transistor not shared by an adjacent memory cell transistor is connected to a selecting line, and one of said two impurity diffusion layers of said second transistor not shared by an adjacent memory cell transistor is connected to a bit line.

* * * * *